United States Patent
Tsai et al.

(10) Patent No.: US 9,178,107 B2
(45) Date of Patent: Nov. 3, 2015

(54) WAFER-LEVEL LIGHT EMITTING DIODE STRUCTURE, LIGHT EMITTING DIODE CHIP, AND METHOD FOR FORMING THE SAME

(75) Inventors: Yao-Jun Tsai, Taoyuan County (TW); Chen-Peng Hsu, Kaohsiung (TW); Kuo-Feng Lin, Taipei County (TW); Hsun-Chih Liu, Taipei County (TW); Hung-Lieh Hu, Hsinchu (TW); Chien-Jen Sun, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 690 days.

(21) Appl. No.: 13/197,677

(22) Filed: Aug. 3, 2011

(65) Prior Publication Data

US 2012/0034714 A1    Feb. 9, 2012

Related U.S. Application Data

(63) Continuation of application No. PCT/CN2010/075684, filed on Aug. 3, 2010.

(30) Foreign Application Priority Data

Jan. 3, 2011    (TW) .............................. 100100045 A

(51) Int. Cl.
*H01L 33/00* (2010.01)
*H01L 33/20* (2010.01)
*H01L 33/44* (2010.01)

(52) U.S. Cl.
CPC ............. *H01L 33/0095* (2013.01); *H01L 33/20* (2013.01); *H01L 33/44* (2013.01); *H01L 2933/0016* (2013.01)

(58) Field of Classification Search
CPC ......... H01L 33/44; H01L 33/62; H01L 33/38; H01L 33/0008; H01L 33/0012; H01L 33/0095; H01L 33/20; H01L 2933/0016
USPC ................................................ 438/33, 38, 39
See application file for complete search history.

(56) References Cited

U.S. PATENT DOCUMENTS

| 7,018,859 B2 | 3/2006 | Liao et al. |
| 7,256,483 B2 | 8/2007 | Epler et al. |

(Continued)

FOREIGN PATENT DOCUMENTS

| CN | 1926694 | 3/2007 |
| CN | 101222014 A | 7/2008 |

(Continued)

OTHER PUBLICATIONS

International Searching Authority, International Search Report, International Application No. PCT/CN2010/075684, May 12, 2011.

(Continued)

*Primary Examiner* — Kevin Parendo

(57) ABSTRACT

A method for fabricating a wafer-level light emitting diode structure is provided. The method includes: providing a substrate, wherein a first semiconductor layer, a light emitting layer, and a second semiconductor layer are sequentially disposed on the substrate; subjecting the first semiconductor layer, the light emitting layer, and the second semiconductor layer with a patterning process to form a first depressed portion, a second depressed portion, a stacked structure disposed on the second depressed portion and a remained first semiconductor layer disposed on the depressed portion, wherein the stacked structure comprises a patterned second semiconductor layer, a patterned emitting layer, and a patterned first semiconductor layer; forming a first electrode on the remained first semiconductor layer of the first depressed portion; and forming a second electrode correspondingly disposed on the patterned second semiconductor layer of the second depressed portion.

11 Claims, 47 Drawing Sheets

(56) References Cited

U.S. PATENT DOCUMENTS

| | | | |
|---|---|---|---|
| 7,432,119 | B2 | 10/2008 | Doan |
| 7,521,724 | B2 | 4/2009 | Chen et al. |
| 7,586,200 | B2 | 9/2009 | Wang |
| 7,598,530 | B2 | 10/2009 | Chu |
| 2002/0070386 | A1 | 6/2002 | Krames et al. |
| 2006/0192223 | A1 | 8/2006 | Lee et al. |
| 2006/0246687 | A1 | 11/2006 | Kaiser et al. |
| 2007/0045648 | A1 | 3/2007 | Lin |
| 2007/0111488 | A1* | 5/2007 | Chakraborty et al. ........ 438/478 |
| 2008/0128721 | A1* | 6/2008 | Watanabe et al. ................ 257/96 |
| 2008/0211416 | A1* | 9/2008 | Negley et al. ................. 315/193 |
| 2008/0308832 | A1* | 12/2008 | Hsieh et al. ...................... 257/98 |
| 2009/0001401 | A1 | 1/2009 | Park et al. |
| 2009/0057706 | A1* | 3/2009 | Chan et al. ...................... 257/99 |
| 2009/0108281 | A1 | 4/2009 | Keller et al. |
| 2009/0147534 | A1* | 6/2009 | Hamada ........................ 362/612 |
| 2009/0278139 | A1 | 11/2009 | Fjelstad |
| 2010/0065843 | A1* | 3/2010 | Kyotani et al. ................. 257/43 |
| 2011/0253999 | A1* | 10/2011 | Chatterjee et al. .............. 257/48 |

FOREIGN PATENT DOCUMENTS

| | | | | |
|---|---|---|---|---|
| CN | | 101237015 A | 8/2008 | |
| CN | | 101400943 | 4/2009 | |
| CN | | 201450017 | 5/2010 | |
| JP | | 2004-165590 | 6/2004 | |
| JP | | 2006-332383 | 12/2006 | |
| JP | | 2007-273898 | 10/2007 | |
| JP | | 2008-177563 | 7/2008 | |
| JP | | 2010-147446 | 7/2010 | |
| TW | | 200408142 | 5/2004 | |
| TW | | I255055 | 5/2006 | |
| TW | | 200637034 | 10/2006 | |
| TW | | I282635 | 6/2007 | |
| TW | | 200725929 | 7/2007 | |
| TW | | 200810149 | 2/2008 | |
| TW | | 200834959 | 8/2008 | |
| TW | | 200924221 | 6/2009 | |
| TW | | I326500 | 6/2010 | |
| TW | | 201126760 | 8/2011 | |
| TW | | 201135977 | 10/2011 | |
| WO | WO 2005/013382 A1 | | 2/2005 | |
| WO | WO 2009/020365 A2 * | | 2/2009 | .............. H01L 33/00 |
| WO | WO 2010/074028 | | 7/2010 | |

OTHER PUBLICATIONS

Taiwan Patent Office, Notice of Allowance, Patent Application Serial No. 099147230, Nov. 28, 2013, Taiwan.
Taiwan Patent Office, Office Action, Patent Application Serial No. 100100045, Oct. 23, 2013, Taiwan.
Taiwan Patent Office, Office Action, Patent Application Serial No. 100149473, Apr. 21, 2014, Taiwan.
China Patent Office, Office Action, Patent Application Serial No. 201080069451.0, Apr. 3, 2015, China.
Taiwan Patent Office, Office Action, Patent Application Serial No. 100100045, May 14, 2015, Taiwan.
China Patent Office, Office Action, Patent Application Serial No. 201180047417.8, May 5, 2015, China.

* cited by examiner

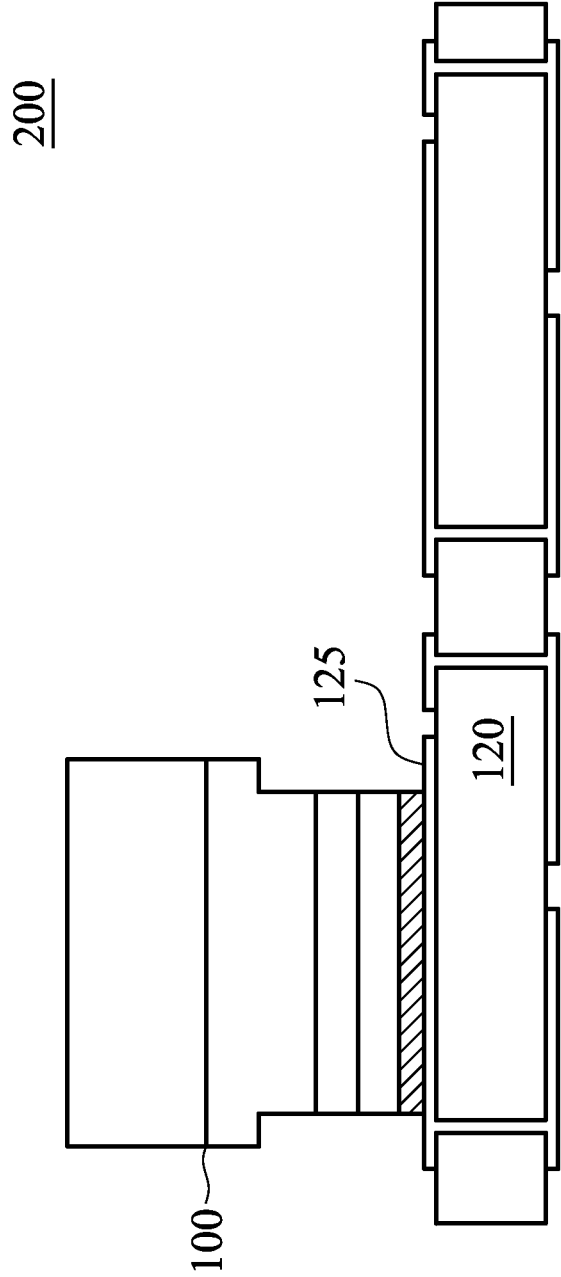

WAFER-LEVEL LIGHT EMITTING DIODE STRUCTURE, LIGHT EMITTING DIODE CHIP, AND METHOD FOR FORMING THE SAME

CROSS REFERENCE TO RELATED APPLICATIONS

This application is based upon and claims the benefit of priority from the prior Taiwan Patent Application No. 100100045, filed on Jan. 3, 2011, the entire contents of which are incorporated herein by reference. Further, this application is based upon and claims the benefit of priority from PCT/CN2010/075684, filed on Aug. 3, 2010, the entire contents of which are incorporated herein by reference.

TECHNICAL FIELD

The present disclosure relates to a light emitting diode structure, a light emitting diode chip, and methods for forming the same, and in particular relates to a wafer-level light emitting diode structure, a light emitting diode chip with high yield, and methods for forming the same.

BACKGROUND

Conventional process for fabricating a thin film light emitting diode (TF-LED) roughly contains two phases. The first phase is to grow epi layers on a growth substrate and thus forming the epi wafer. The growth substrate can either be made of sapphire or silicon carbide. The number of epi layer can be designed according to the need. The second phase is to bond the epi wafer to a support substrate (such as a sub-mount or a packaging substrate), to remove the growth substrate, and to perform further semiconductor processes such as etching, photolithographing, development and phosphor coating. During the fabricating process of TF-LED, it's difficult to measure the photoelectric properties, such as the characteristics of current-voltage or spectrum of the epi wafer. Accordingly, said photoelectric properties of TF-LED are inspected and measured after the completion of two-phase process of TF-LED.

In the above process, particularly in the second phase of making a TF-LED, the semiconductor process is performed onto the entire epi-layer bonded with the support substrate. The photoelectric properties interim are hardly to be inspected, leading to a poor yield rate of TF-LED to 50% or even worse. More specifically, only 50% or fewer chips, though bonded with the support substrate, could meet the predetermined photoelectric properties. This means that all the chips, whether they meet the pre-determined photoelectric properties or not, have to undertake the subsequent fabrication process. For the chips that fail to meet the required photoelectric properties, the bonding with the support substrate appears to be unnecessary and a waste. Noted that LEDs to meet the required bins standard is often the challenge to most of the manufacturers when competing among one another. Therefore, promoting the yield rate of LEDs and cost-down is always the important issue to each LED maker.

SUMMARY

The disclosure provides a wafer-level light emitting diode structure, comprising: a substrate and a first semiconductor layer disposed on the substrate, wherein the first semiconductor layer comprises at least one extended portion and at least one protruded portion, and the extended portion at least partially overlaps with a predetermined cutting range; at least one emitting layer correspondingly disposed on the protruded portion of the first semiconductor layer; at least one second semiconductor layer, correspondingly disposed on the light emitting layer; at least one first electrode disposed on the extended portion of the first semiconductor layer; and at least one second electrode correspondingly disposed on the second semiconductor layer.

In another exemplary embodiment of the disclosure, the wafer-level LED structure includes a substrate having a plurality of stacked structure predetermined regions and at least one non-stacked structure predetermined region; a plurality of stacked structures disposed in the stacked structure predetermined regions, wherein the stacked structure comprises a first semiconductor layer; a light emitting layer; and a second semiconductor layer and a second electrode sequentially disposed on the stacked structure predetermined region; and at least one first electrode disposed on the non-stacked structure predetermined region.

The disclosure further provides a light emitting diode chip obtained by cutting the aforementioned wafer-level light emitting diode structure into a plurality of light emitting diode (LED) chips. The light emitting diode chip comprises a substrate having a boundary; a first semiconductor layer disposed on the substrate; a light emitting layer disposed on the first semiconductor layer; and a second semiconductor layer disposed on the light emitting layer, wherein the LED chip for sale is characterized by comprising only one electrode disposed on the second semiconductor layer.

Moreover, the disclosure also provides a method for fabricating the aforementioned wafer-level LED structure, including: providing a substrate, wherein a first semiconductor layer, a light emitting layer, and a second semiconductor layer are sequentially disposed on the substrate to form a stacked structure; subjecting the stacked structure with a patterning process to form a first depressed portion, a second depressed portion, wherein the stacked structure approximately located on the second depressed portion with a extended portion of the first semiconductor layer located on the first depressed portion; forming a first electrode on the extended portion of the first semiconductor layer located on the first depressed portion; and forming a second electrode on the surface of the second semiconductor layer located on the second depressed portion.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein:

FIG. 1 is the cross-section along the line 1-1' in FIG. 9.

FIGS. 36-38 are cross-sections of light emitting diode package structures according to other embodiments of the disclosure.

DETAILED DESCRIPTION

For the convention light emitting diode chip manufacturing process, it is difficult to identify a flawed chip on the front end thereof, thus resulting in poor yield rate of light emitting diode chips fabricated thereby. In order to solve the aforementioned problems, the disclosure provides a method of inspection and labeling LEDs according to required bins standard during the early stage of manufacturing process. The disclosure also provides light emitting diode chip and a light emitting diode package structure employing the mentioned method to increase production yield and reduce production costs.

Figure 1:
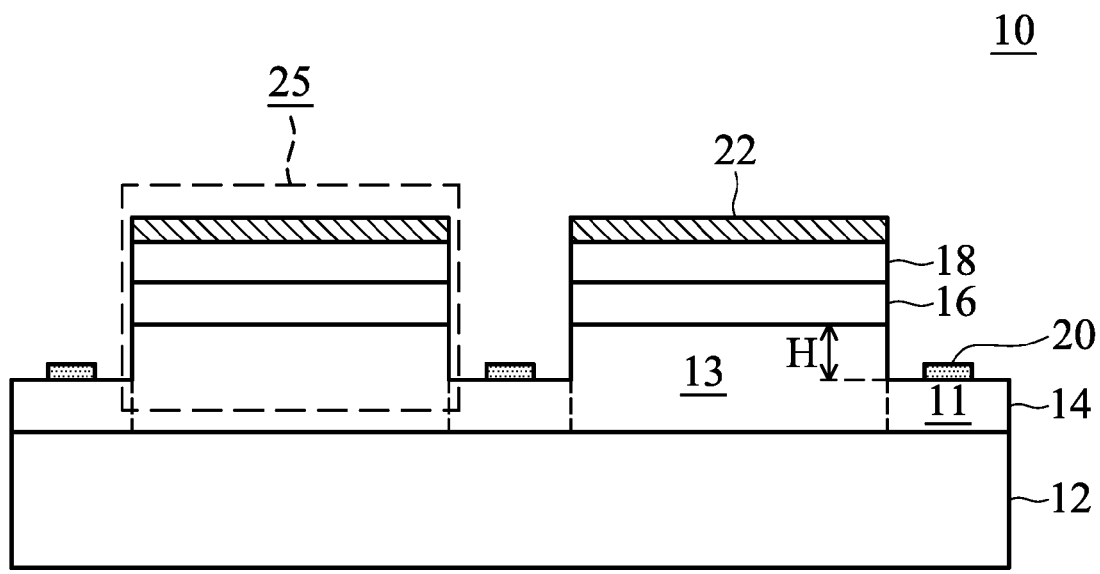
FIG. 1 is a cross-section of a wafer-level LED structure according to an embodiment of the disclosure.

According to an embodiment of the disclosure, the light emitting diode structure 10 may have a structure as illustrated in FIG. 1. The light emitting diode structure 10 includes a growth substrate 12 and a first semiconductor layer 14 disposed thereon, wherein the first semiconductor layer 14 includes an extended portion 11 and a protruded portion 13. The extended portion 11 and the protruded portion 13 may have a height difference H. A light emitting layer 16 is disposed on the protruded portion 13 of the first semiconductor layer 14. A second semiconductor layer 18 is disposed on the light emitting layer 16. A first electrode 20 is disposed on the extended portion 11 of the first semiconductor layer 14. A second electrode 22 is disposed on the second semiconductor layer 18, wherein the second electrode 22 may have a reflective index which is greater than 70% of the dominant wavelength of the vertical incident light emitted by the light emitting layer. The growth substrate 12 may be any substrates suitable for the growth of the LED semiconductor layers, for example, the growth substrate 12 may be formed of an aluminum oxide substrate (sapphire substrate), silicon carbide substrate, or gallium arsenic substrate.

The growth substrate 12 may have a thickness which is larger than 150 μm, or larger than 200 μm (if the substrate is a silicon carbide substrate, or a gallium arsenic substrate).

The light emitting layer 16 may have a multiple quantum wells (MQW) structure. The light emitting layer 16 may be a semiconductor layer made by a semiconductor material selected from the groups consisting of III-V group elements, II-V group elements, IV group elements, IV-IV group elements or combinations thereof, such as AlN, GaN, AlGaN, InGaN, AlInGaN, GaP, GaAsP, AlGaInP or AlGaAs. The first semiconductor layer 14 and the second semiconductor layer 18 are respectively a N-type epi-layer and a P-type epi-layer. Note that types of the epi-layers can be alternately exchanged, and is not limited by the present disclosure. The first semiconductor layer 14 and the second semiconductor layer 18 may also be formed of a semiconductor materials selected from the groups consisting of III-V group elements, II-V group elements, IV group elements, IV-IV group elements or combinations thereof. For instance, the first semiconductor layer 14 is an N-type GaN semiconductor, wherein the second semiconductor layer 18 is a P-type GaN semiconductor, and vice versa. The light emitting layer 16 may also be a GaN semiconductor. The second electrode 22 may include an Ohmic contact made of Pd, Pt, Ni, Au, Ag or combinations thereof, a diffusion layer, or a bonding metal layer. A transparent conductive layer (TCL) made from indium tin oxide (ITO), cadmium tin oxide (CTO), antimony tin oxide (ATO), zinc aluminum oxide or zinc tin oxide can be the second electrode 22 as well. The second electrode 22 may further include a reflective layer for reflecting light emitted by the light emitting layer 16.

The first electrode 20 may have a thickness which is larger than 2000 Å, or larger than 5000 Å, or further larger than 1 μm, and can be an Ohmic contact, an indium ball, or a thick metal pad (suitable for point probe measurement).

Figure 2:
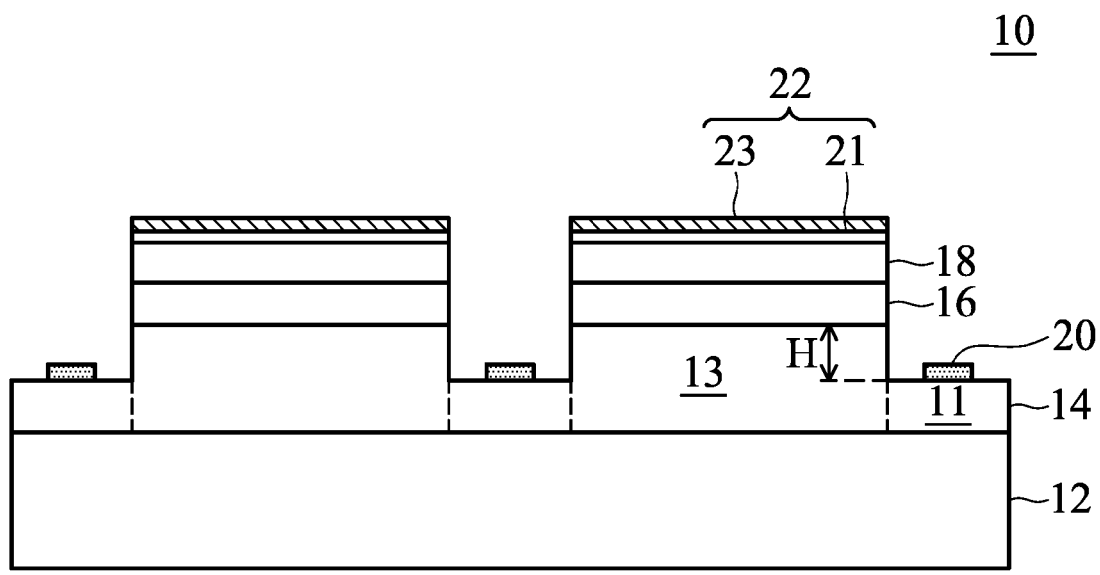
FIGS. 2-8 are cross-sections of wafer-level LED structures according to embodiments of the disclosure.
Figure 3:
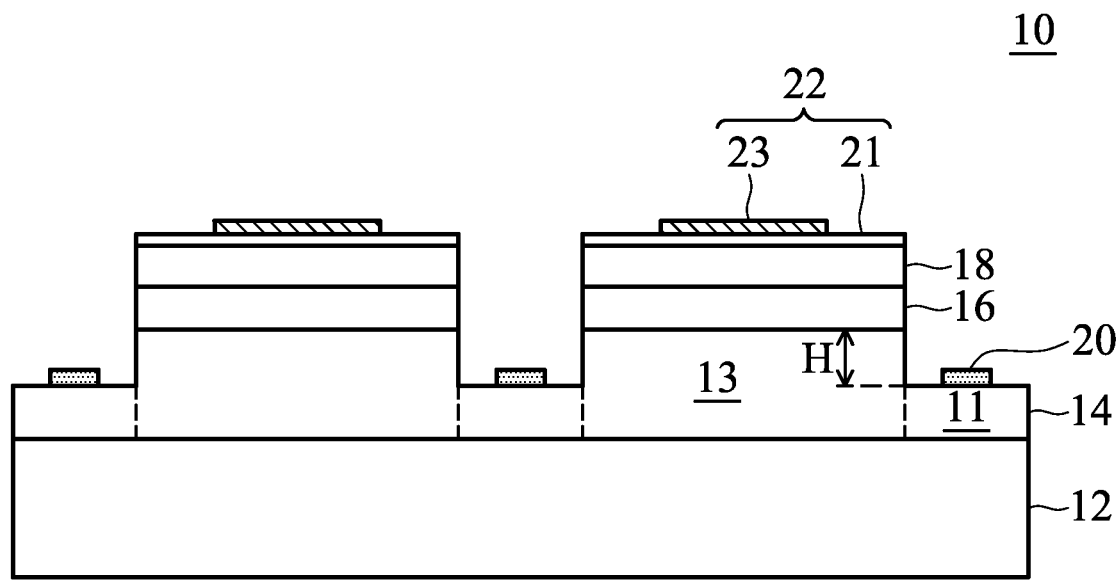
Figure 31:
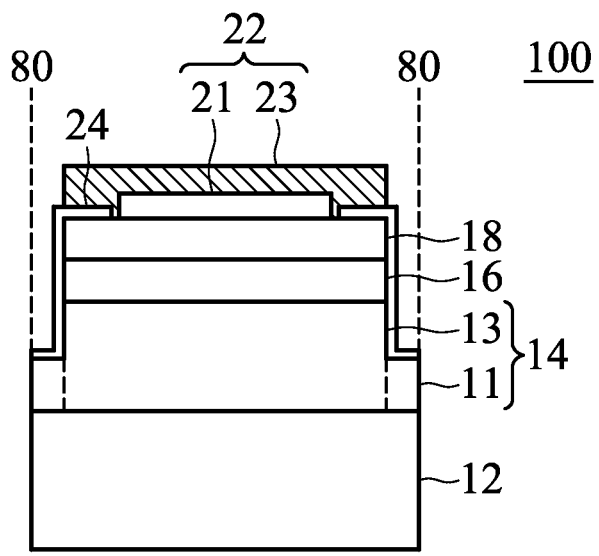

As shown in FIG. 2, the area of the reflective layer 21 can be larger than or equal to the area of the bonding metal layer 23 to promote reflection efficiency. According to yet another embodiment of the disclosure, the area of the reflective layer 21 can be less than the area of the bonding metal layer 23, as shown in FIG. 31, and thus the bonding metal layer 23 can completely cover the reflective layer 21. In particular, when the reflective layer 21 is made of silver, the bonding metal layer 23 can completely cover the silver reflective layer 21 to enhance the reflection efficiency as well as prevent silver atoms from thermal diffusion. As shown in FIG. 3, the first electrode 20 and the second electrode 22 are shown in cross-section view as flat strips for illustration purposes. However, the shape of the first electrode 20 or the second electrode 22 is not limited to the present disclosure and can be of any suitable shape, such as a polygonal, a circle, finger-types or combinations thereof.

In the light emitting diode structure 10 according to an embodiment of the disclosure, the first electrode 20 and the second electrode 22 are formed on the first semiconductor layer 14 and the second semiconductor layer 18, respectively. The characteristics of current-voltage, driving voltage, and spectrum of the stacked structure 25 (a semiproduct of the light emitting diode chip) consisting of the first semiconductor layer 14, the light emitting layer 16 and the second semiconductor layer 18 can be inspected and measured on the front end during the manufacturing process via the first electrode 20 and the second electrode 22. Thus, flawed chips can be identified and marked and the specified bins standard can be categorized well in advance.

Figure 4:
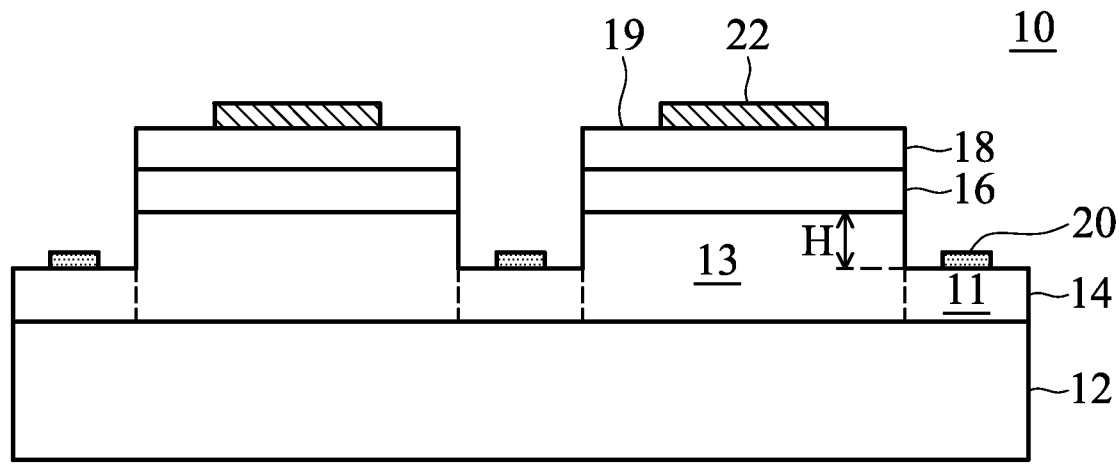

In the light emitting diode structure 10 according to another embodiment of the disclosure, the second electrode 22 can cover only a portion of the top surface 19 of the second semiconductor layer 18. As shown in FIG. 4, the remaining portion of the top surface 19 of the second semiconductor layer 18 can be exposed. The design provides the flexibility in the relative area between the second electrode 22 and the second semiconductor layer 18. To strengthen the adhesion between the second electrode 22 and carrier substrate (will be described in the following paragraphs) during the Laser Lift Off (LLO) process, a second electrode 22 having a larger contact area with the second semiconductor layer 18 will be more appreciated. It is noted that the relative area between the second electrode 22 and the second semiconductor layer 18 can be at least 30% or above in order to benefit from the strengthened adhesion during LLO.

Since the second electrode 22 is disposed on the second semiconductor layer 18, heat generated from the stacked structure 25 can be transferred from the second semiconductor layer 18 to the second electrode 22. In this regard, the second electrode 22 functions as a heat dissipation means. The thermal interface (or contact surface) between the second electrode 22 and the second semiconductor layer 18 is preferably to be large in order to dissipate heat generated and strengthen the adhesion of the stacked structure 25 with the support substrate. For instance, the relative area between the second electrode 22 and the second semiconductor layer 18 can be approximately 30%~99% of the top surface 19 of the second semiconductor layer 18. Preferably, the contact surface falls within 71%~95% of the top surface 19 of the second semiconductor layer 18. In some cases, relative area between the contact surface and the second semiconductor layer 18 can be 51%~70%.

Figure 5:
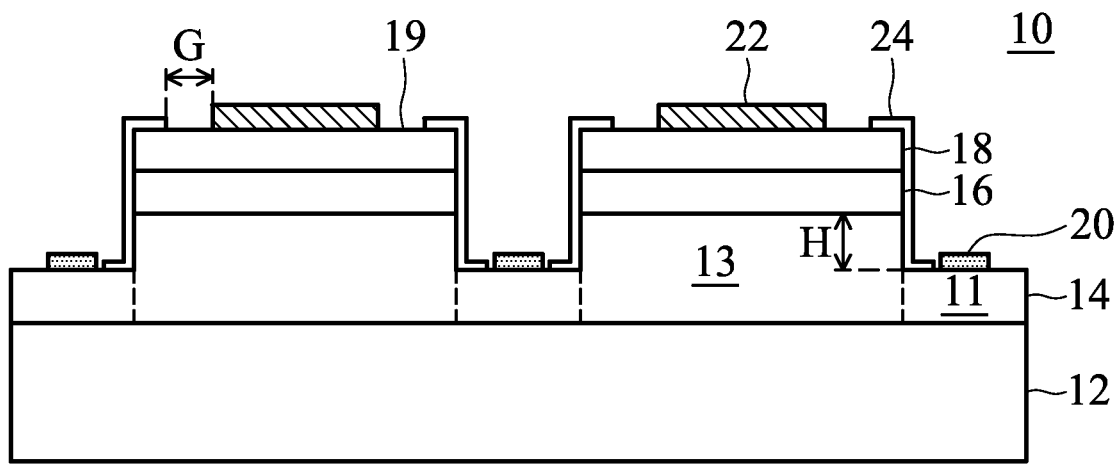

According to an embodiment of the disclosure, as shown in FIG. 5, the light emitting diode structure 10 can further include a passivation layer 24 disposed on the top surface 19 of the second semiconductor layer 18, leaving a gap G therebetween. The passivation layer 24 may be formed of dielectric materials such as silicon oxide, silicon nitride, aluminum nitride, titanium oxide, aluminum oxide or combinations thereof, or a Schottky contact material. The passivation layer 24 covers at least sidewall of the light emitting layer 16 so as to prevent current leakage. The gap G provides space for the second electrode 22 when it is bonded with a carrier substrate, thus preventing the passivation layer 24 from deformation.

Figure 6:
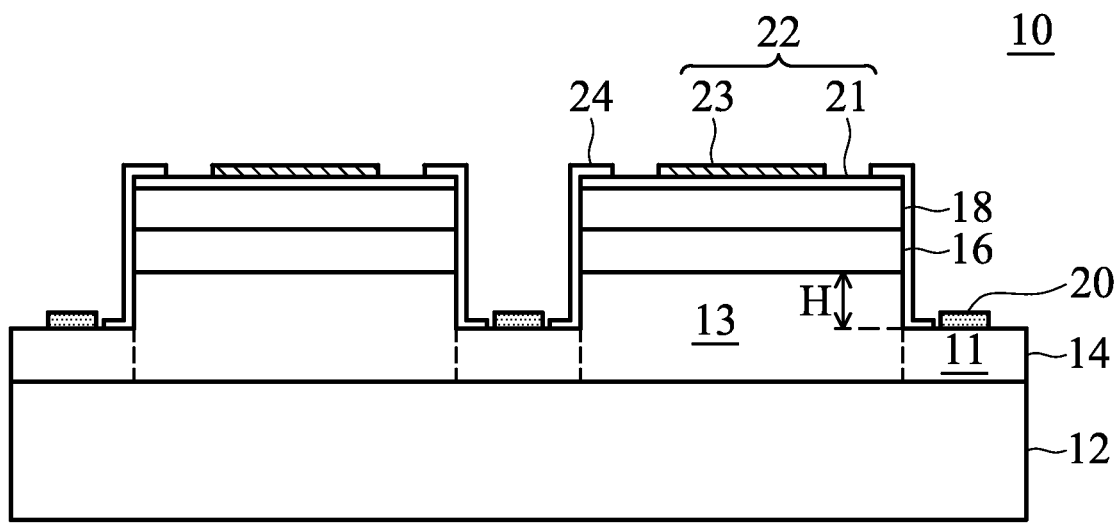

Further, as shown in FIG. 6, the second electrode 22 includes a reflective layer 21 and a bonding metal layer 23. The relative area between the bonding metal layer 23 and the reflective layer 21 and the benefits thereof have been mentioned previously.

Since the passivation layer 24 is an insulating film, the second electrode 22 may be further extended to cover the passivation layer 24. Therefore, the structure shown in FIG. 7 can protect semiconductor layers 14, 18 from damage or cracking during the removal process of the growth substrate 12. In addition, a patterned passivation layer 24, as shown in FIG. 8, may be interposed between the second semiconductor layer 18 and the second electrode 22. The spaced and isolated structures of patterned passivation layer 24 make it possible for the second semiconductor layer 18 to directly contact with the second electrode 22, thus helping to improve the uniformity of current distribution.

Figure 9:
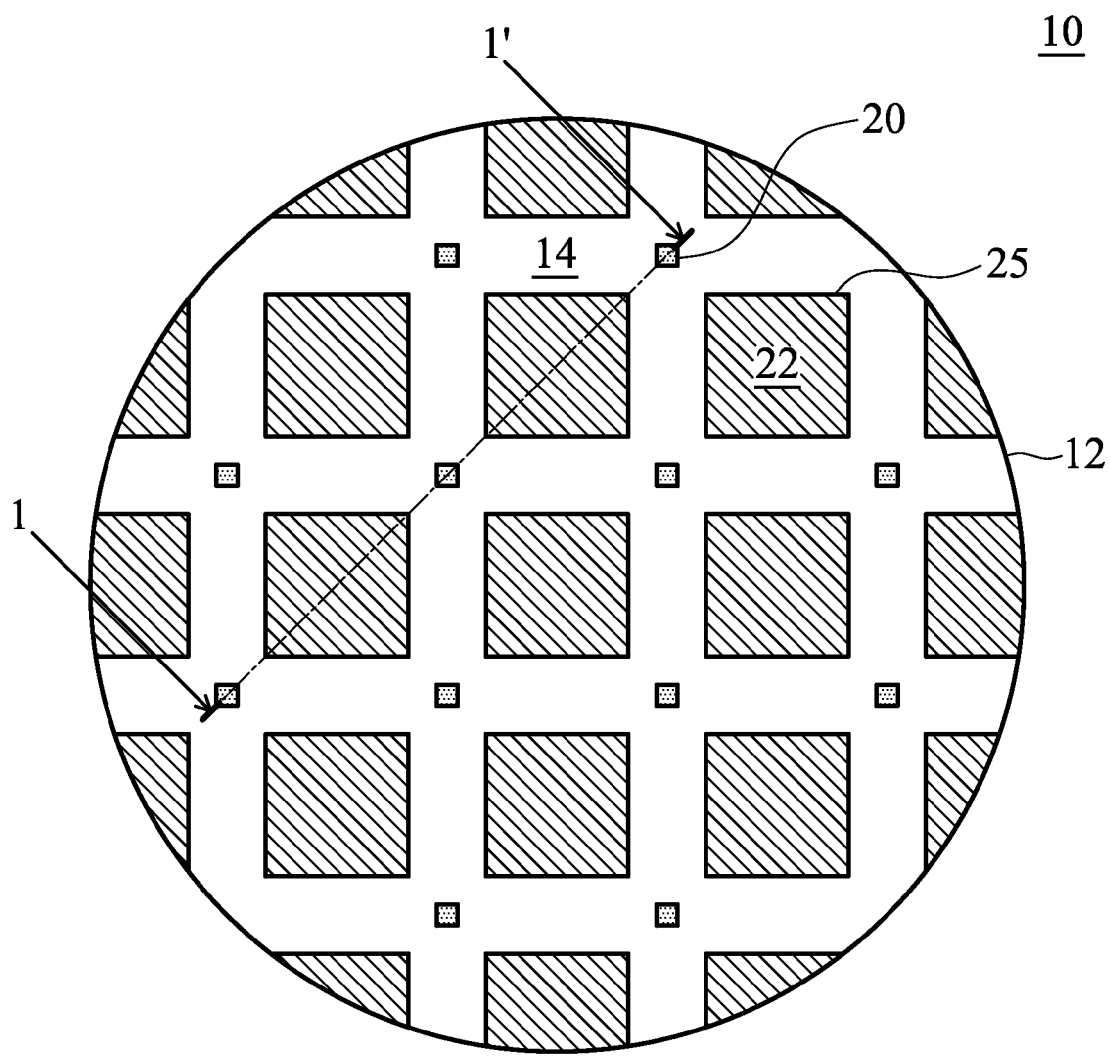
FIG. 9 is a top view of the wafer-level LED structure of FIG. 1
Figure 10:
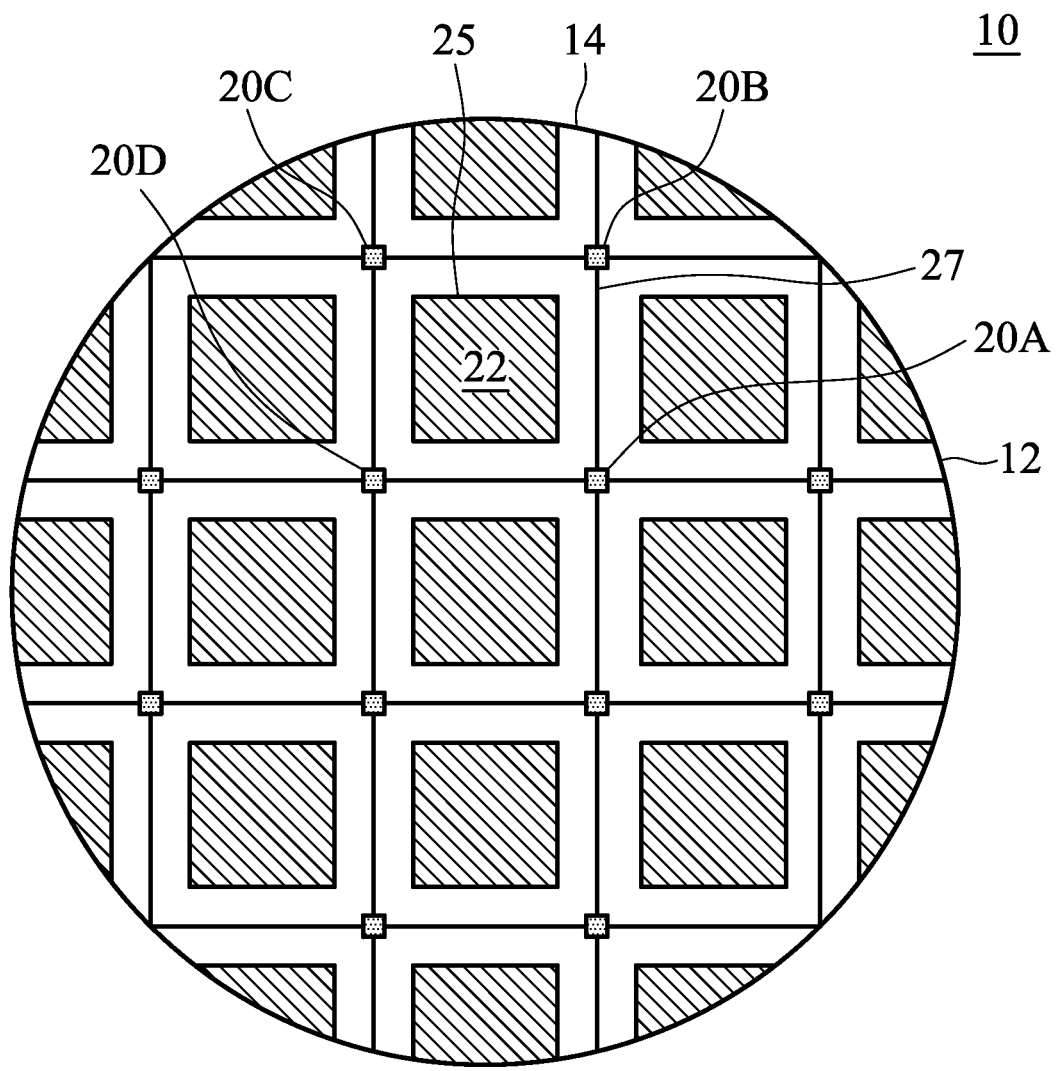
FIGS. 10-12 are top views of the wafer-level LED structures according to embodiments of the disclosure.
Figure 11:
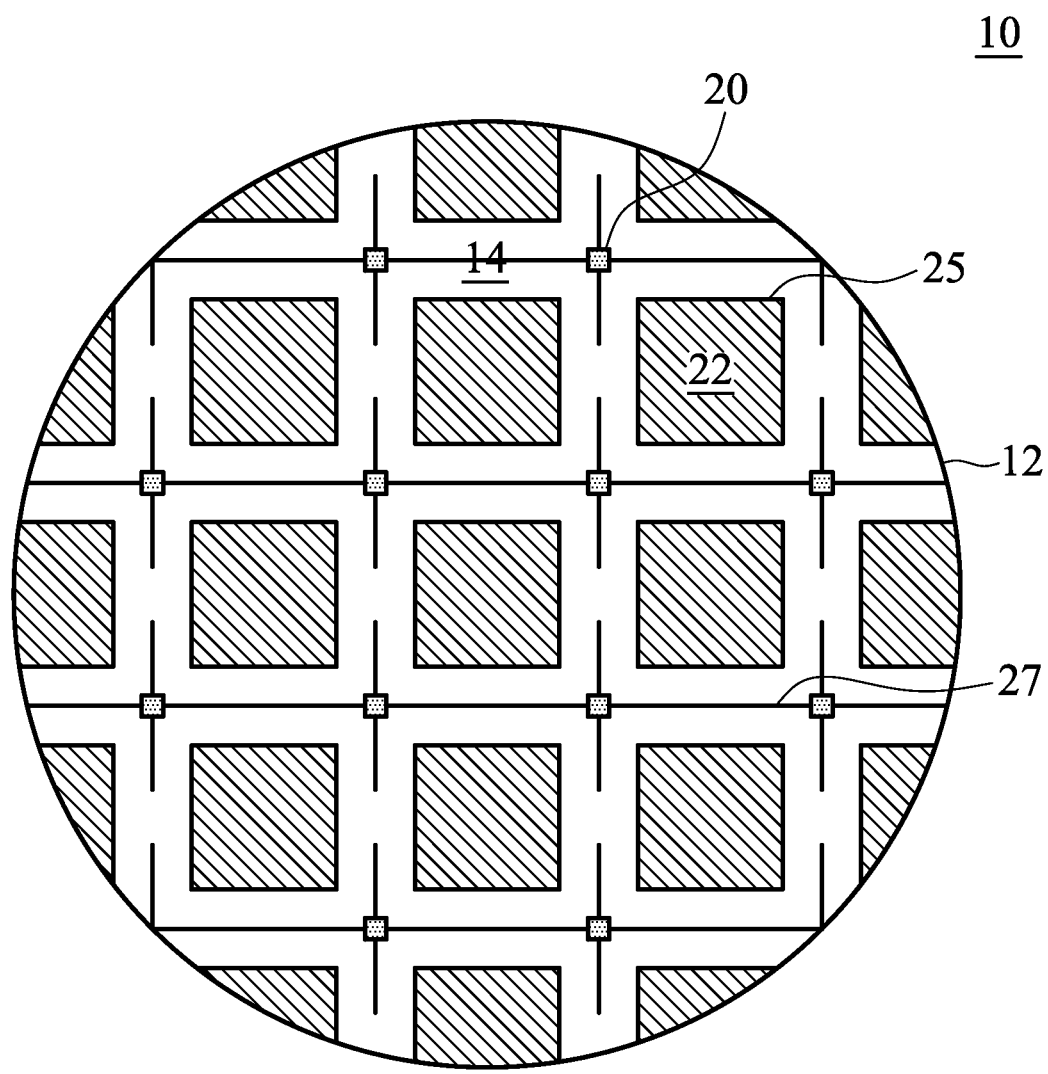
Figure 12:
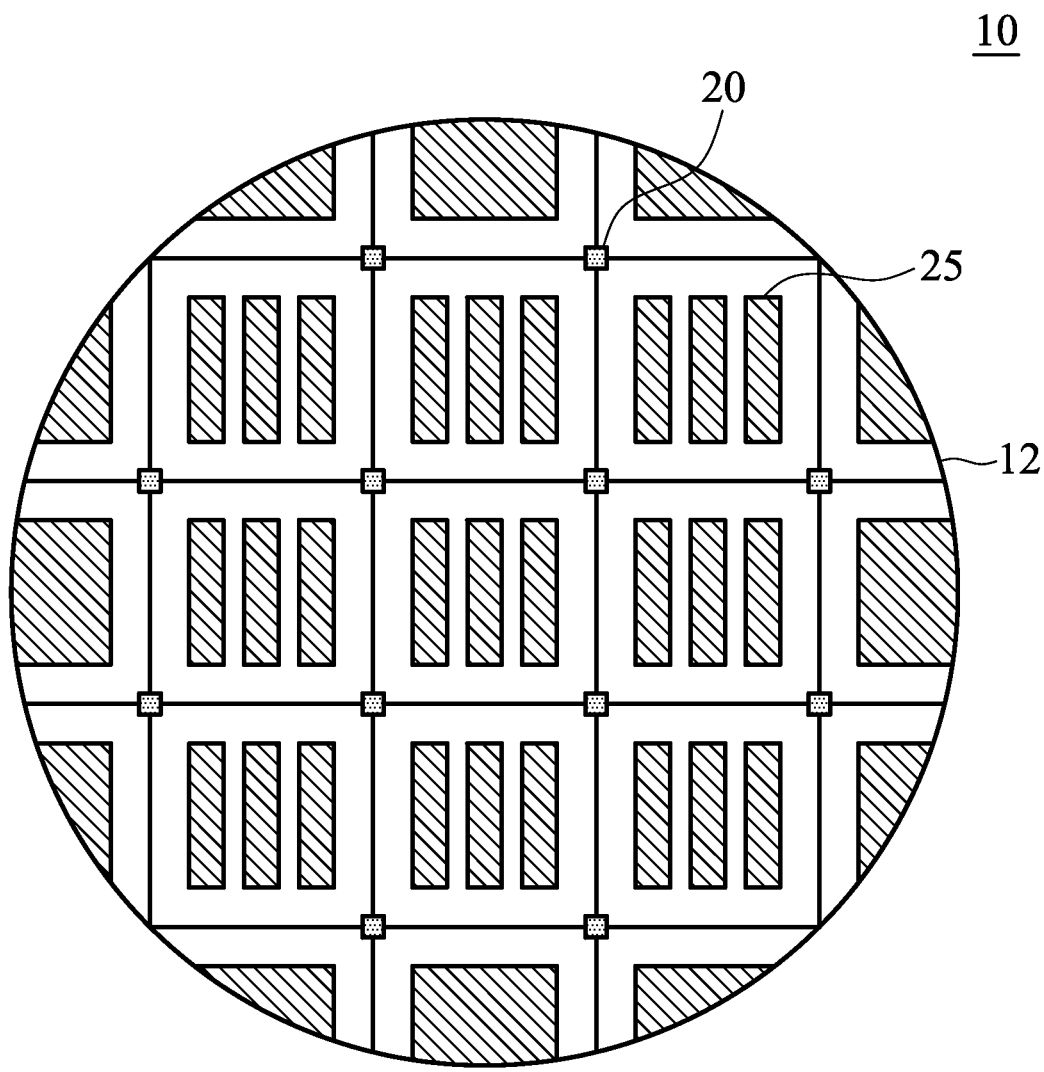

Please refer to FIG. 9, illustrated is a top view of the light emitting diode structure 10 shown in FIG. 1 (FIG. 1 is a cross-sectional view along line 1-1' in FIG. 9). As shown in FIG. 9, the first electrode 20 (having an island shape) is disposed on the first semiconductor layer 14. By applying voltage difference between the first electrode 20 and the second electrode 22 of the stacked structure 25 (a semiproduct of the light emitting diode chip), the bins standard, such as the characteristics of voltage-current, chromaticity coordinate, and spectrum can be easily inspected and categorized. Further, as shown in FIG. 10, the plurality of first electrodes 20A~D disposed on the first semiconductor layer 14 may be electrically connected to each other through conductive circuits 27. Since the first electrodes 20A~D are connected and encircle the stacked structure 25, the uniformity of current spreading can greatly be improved when applying voltage difference between the second electrode 22 and the plurality of the first electrodes 20A~D. FIG. 11 illustrates a variation of the embodiment of FIG. 10, wherein a plurality of the first electrodes 20 is partially connected via conductive circuits 27. The freedom of connection among the first electrodes 20 allows the designer to adjust the current spreading based on actual requirement. Note that the shape of the stacked structure 25 can be designed by photolithography. As shown in FIG. 12, a plurality of stacked structures 25 in rectangular shape is obtained. The flexibility of configuration of stacked structures 25 would make the light beam patterns to be projected in accordance with the shape and arrangement of those stacked structures 25.

Figure 13A:
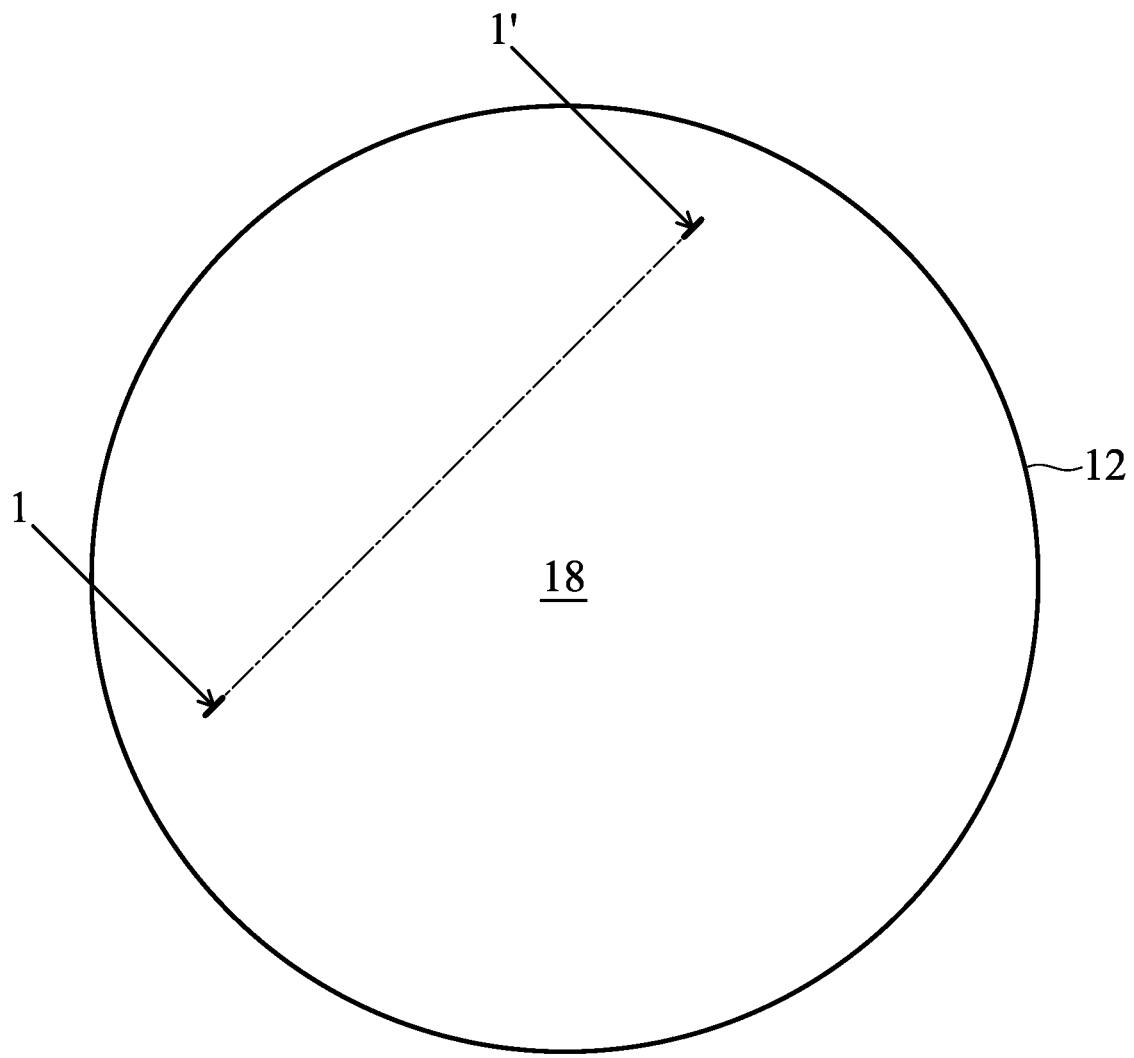
FIGS. 13A, 14A, and 15A are a series of top views showing the process for fabricating the wafer-level LED structure of FIG. 1.
Figure 13B:
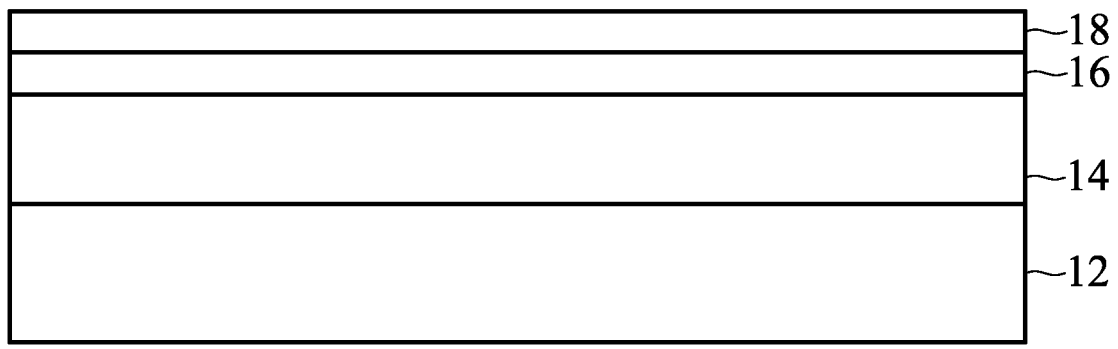
FIGS. 13B, 14B, and 15B are cross-sections respectively corresponding to FIGS. 13A, 14A, and 15A.

A method for forming the light emitting diode structure 10 according to the embodiment shown in FIG. 1 will be described with references made to the accompanying drawings. First, please refer to FIGS. 13A and 13B (a cross-section along line 1-1' of FIG. 13A), wherein a growth substrate 12 is provided, and a first semiconductor layer 14, a light emitting layer 16 and a second semiconductor layer 18 are formed on the growth substrate 12 in order, wherein the forming methods of the first semiconductor layer 14, the light emitting layer 16 and a second semiconductor layer 18 are not limited, and any suitable method in the art can be used, for example, chemical vapor deposition (CVD), metal organic chemical vapor deposition (MOCVD), plasma enhanced chemical vapor deposition (PECVD) or sputtering methods.

Figure 14A:
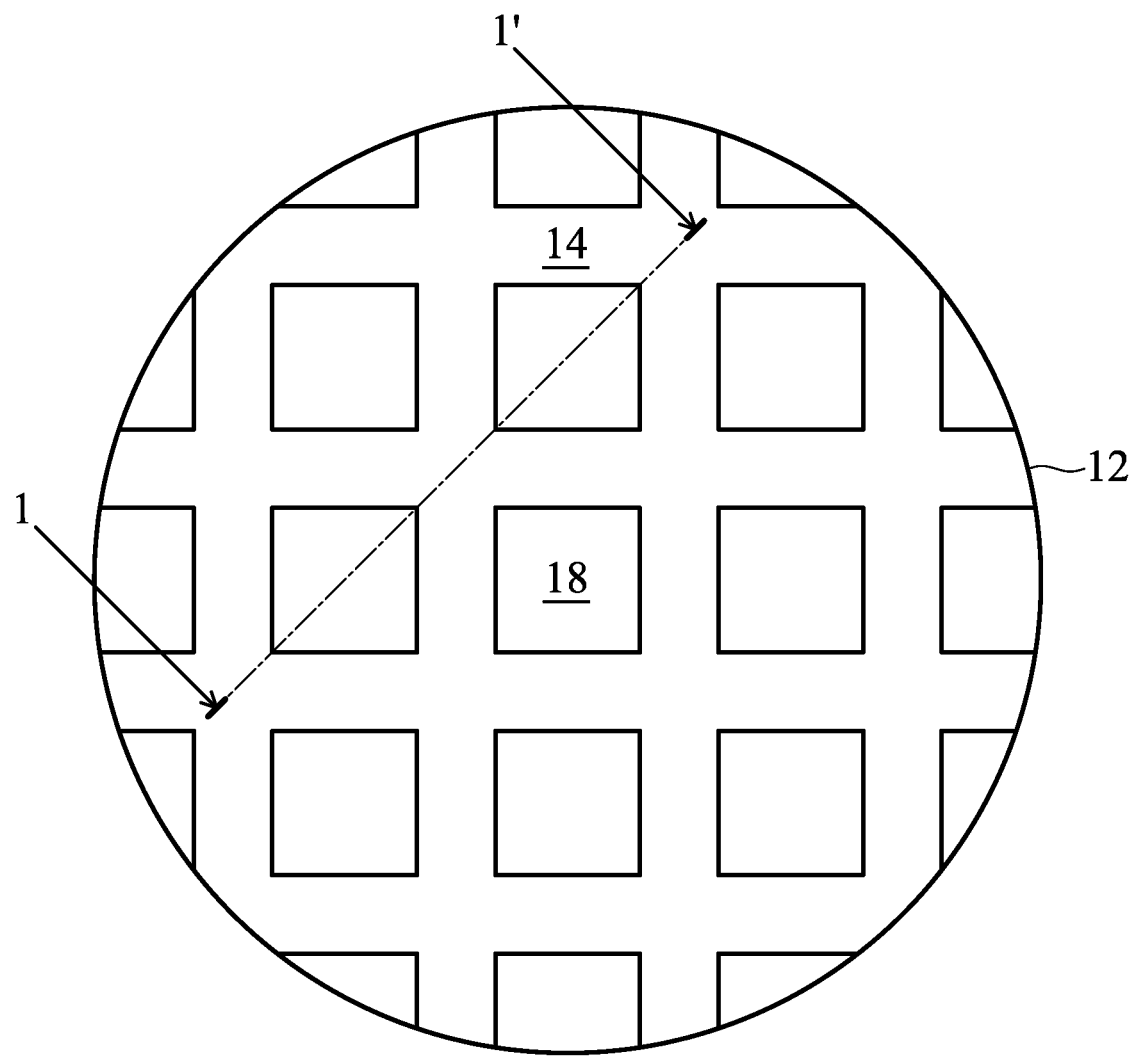
Figure 14B:
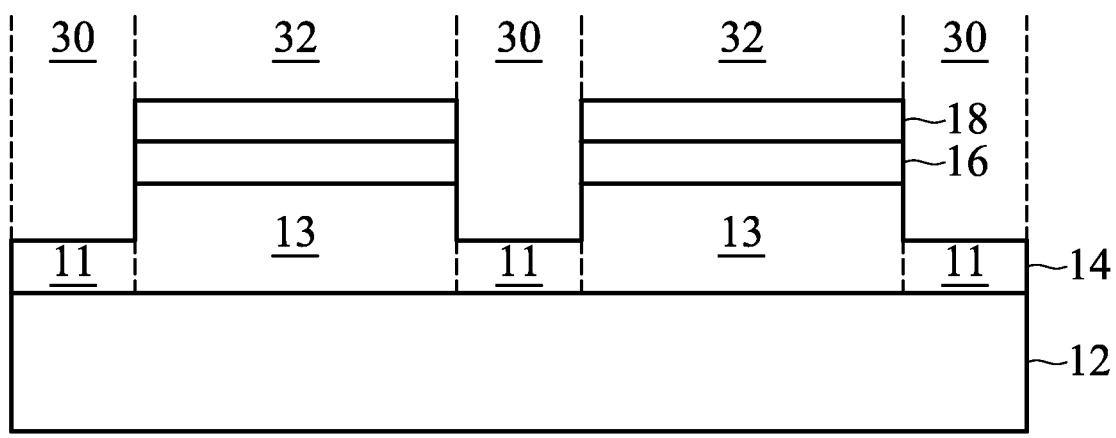

Next, please refer to FIG. 14A and FIG. 14B, wherein FIG. 14B is a cross-section along line 1-1' of FIG. 14A. A patterning process is performed on the first semiconductor layer 14, the light emitting layer 16 and a second semiconductor layer 18 to define a plurality of the first depressed portions 30 and a plurality of the second depressed portions 32. After the patterning process, the extended portion 11 of the first semiconductor layer 14 on the growth substrate 12 approximately falls within the first depressed portion 30. Meanwhile, a protruded portion 13 of the first semiconductor layer 14, the light emitting layer 16, and the second semiconductor layer 18 on the growth substrate 12 locates within the second depressed portion 32. The patterning process may be a lithography process.

Figure 15A:
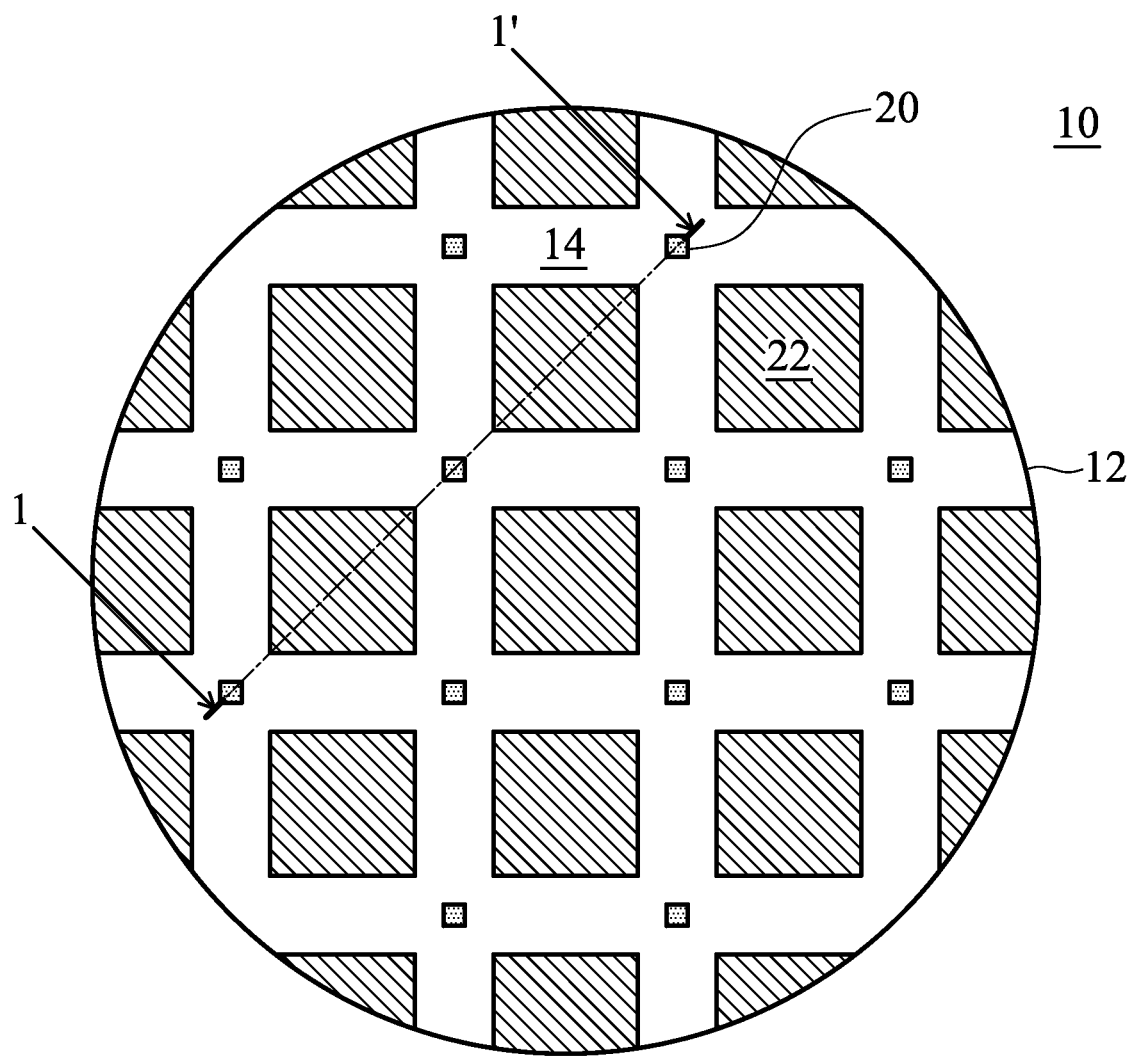
Figure 15B:
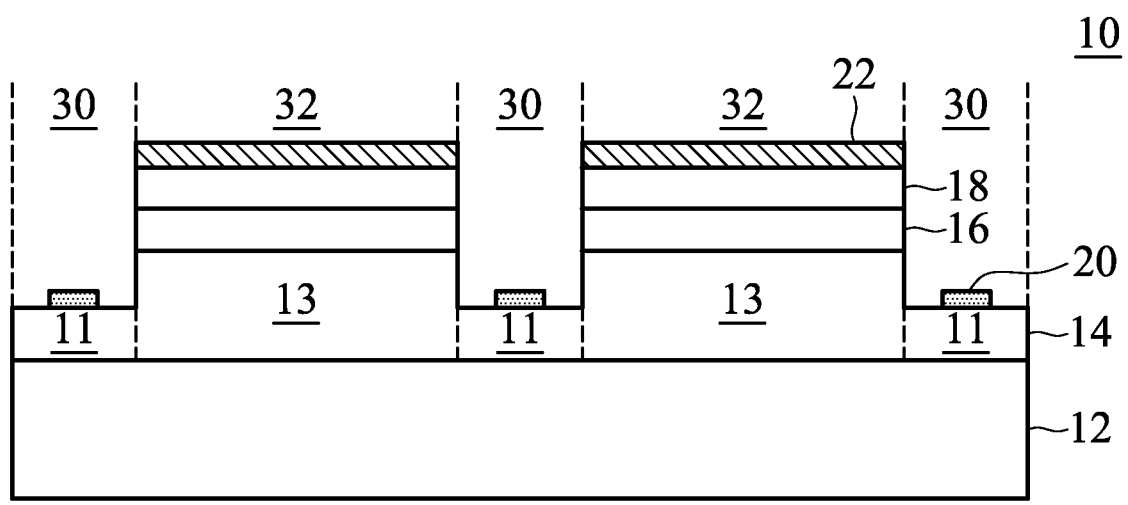

Finally, please refer to FIGS. 15A and 15B, wherein FIG. 15B is a cross-section along line 1-1' of FIG. 15A. A plurality of first electrodes 20 are formed on the extended portion 11 of the first semiconductor layer 14 within the first depressed portion 30, then a plurality of second electrodes 22 are formed on the second semiconductor layer 18 located in the second depressed portion 32. Alternatively, the plurality of second electrodes 22 can be formed preceding to the plurality of first electrodes 20.

Figure 7:
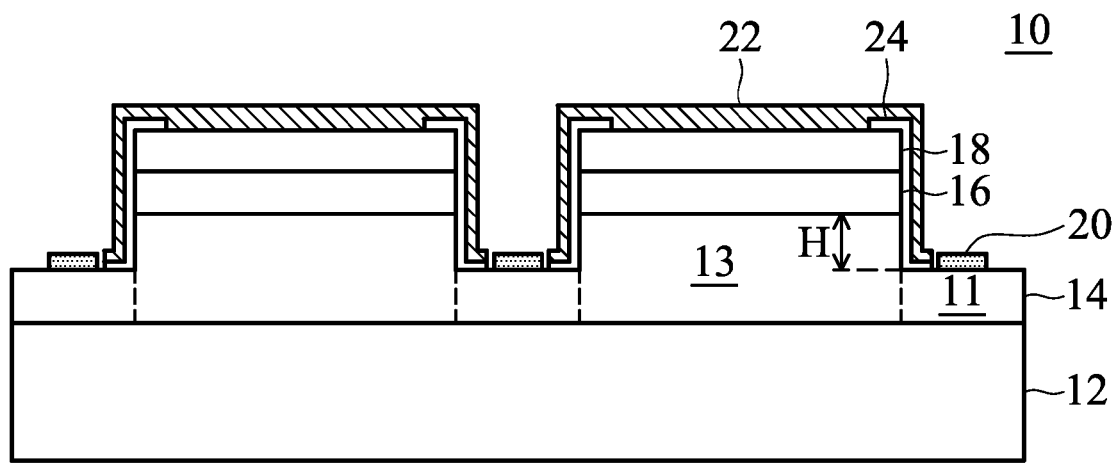
Figure 8:
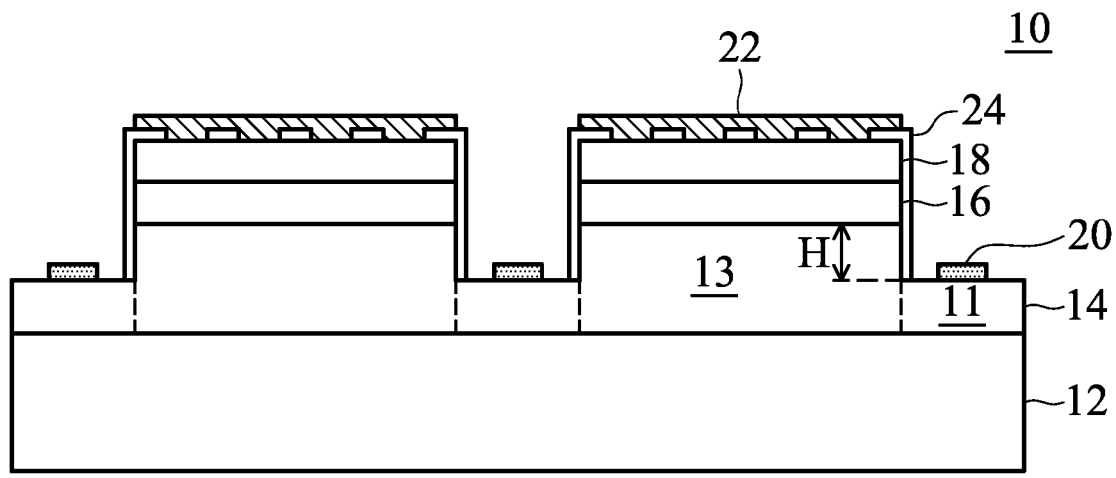

Furthermore, according to other embodiments of the disclosure, the method of forming the light emitting diode structure further includes forming a patterned passivation layer 24 on the second semiconductor layer before forming the second electrode, as shown in FIGS. 7 and 8. The passivation layer 24 covers at least sidewall of the light emitting layer 16 to prevent current leakage. The forming of passivation layer 24 can be performed after the placement of the second electrode 22, as shown in FIGS. 5 and 6.

After the completion of semiproduct of the light emitting diode structure 10, the photoelectric properties may be inspected via the first electrode 20 and the second electrode 22. Chips meeting the required bins standard are marked. It should be noted that multiple adjacent stacked structures 25 can be measured via a common first electrode 20 and the respective second electrodes 22 on the stacked structures 25. Since a common first electrode 20 is employed for measurement of the multiple stacked structures 25, the number of the first electrode 20 can be fewer than that of the stacked structures 25. Therefore, space designated for forming the first electrode 20 can be spared, and the spared space of epi-wafer can be used to form the stacked structures 25 as many as possible.

Figure 39A:
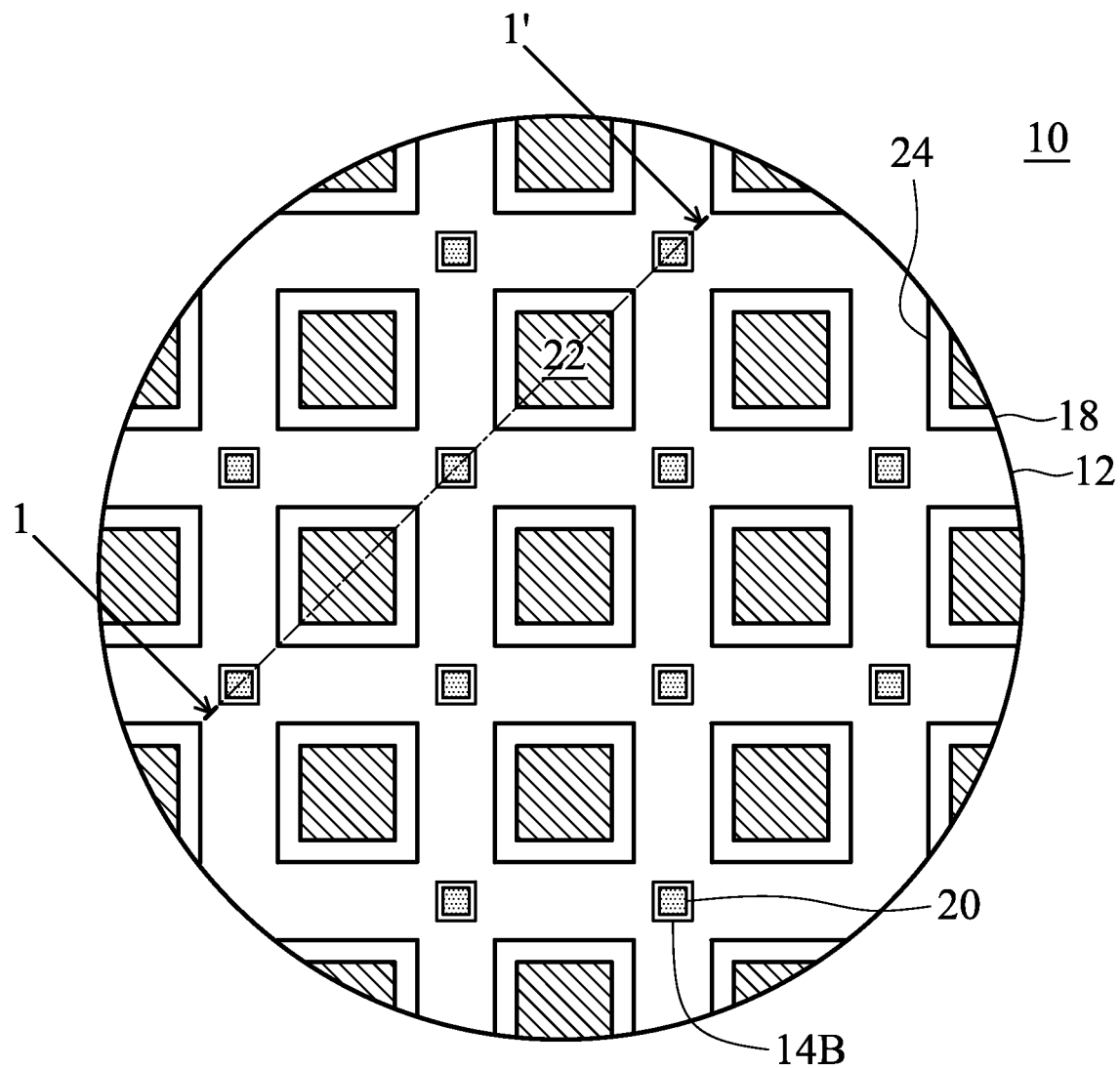
FIGS. 39A, and 40A are a series of top views showing a method for cutting the wafer-level LED structure according to another embodiment of the disclosure.
Figure 39B:
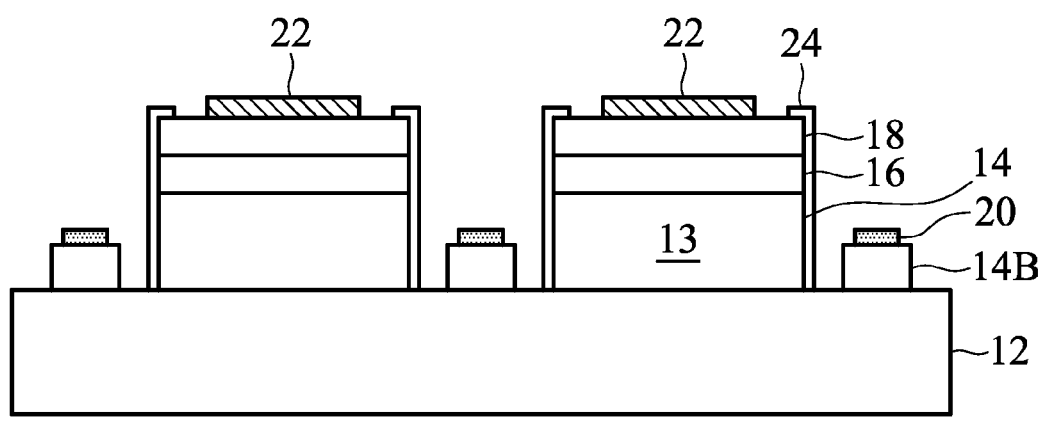
FIGS. 39B, and 40B are a series of cross-sections respectively corresponding to FIGS. 39A, and 40A.
Figure 40A:
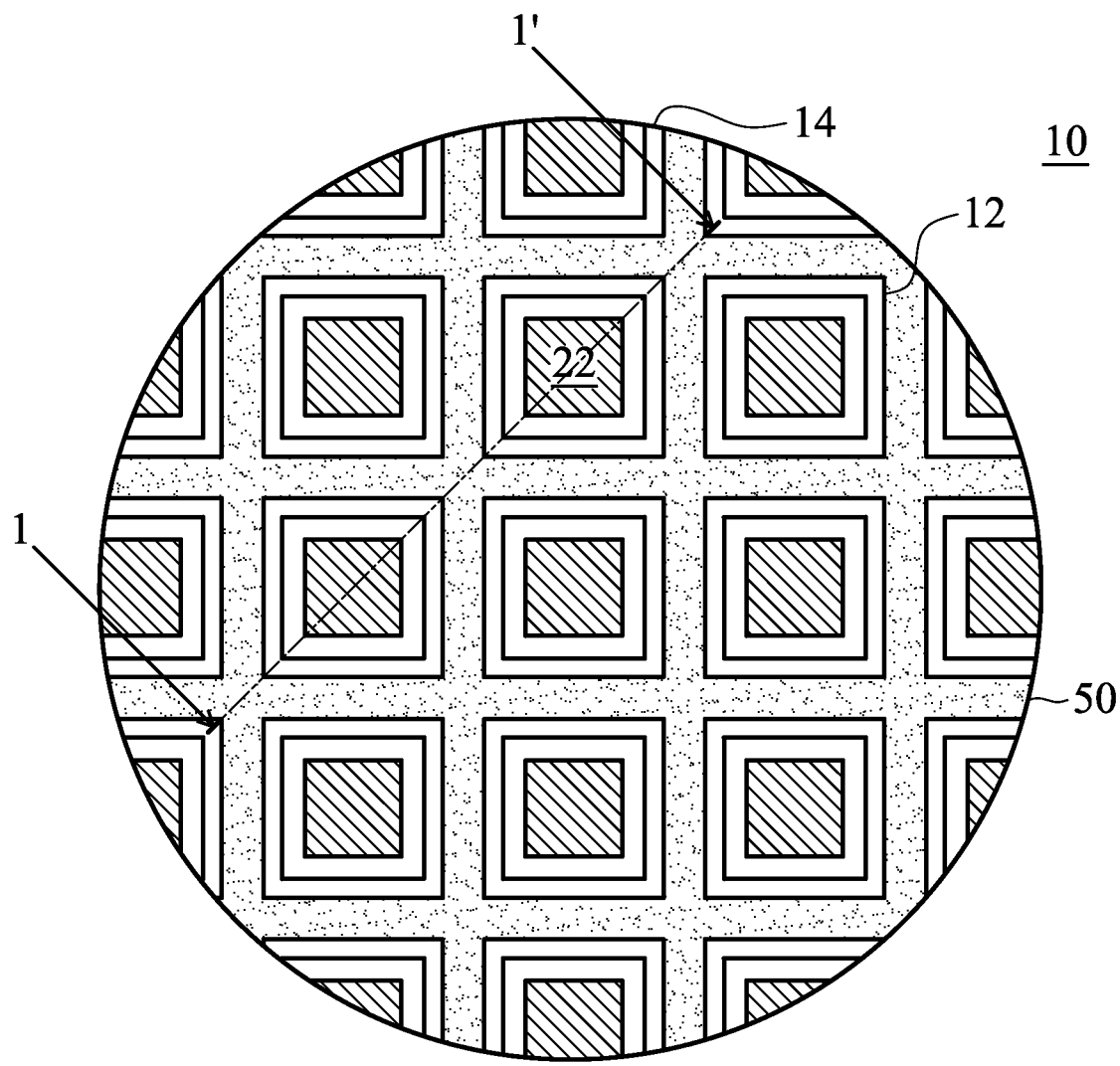
Figure 40B:
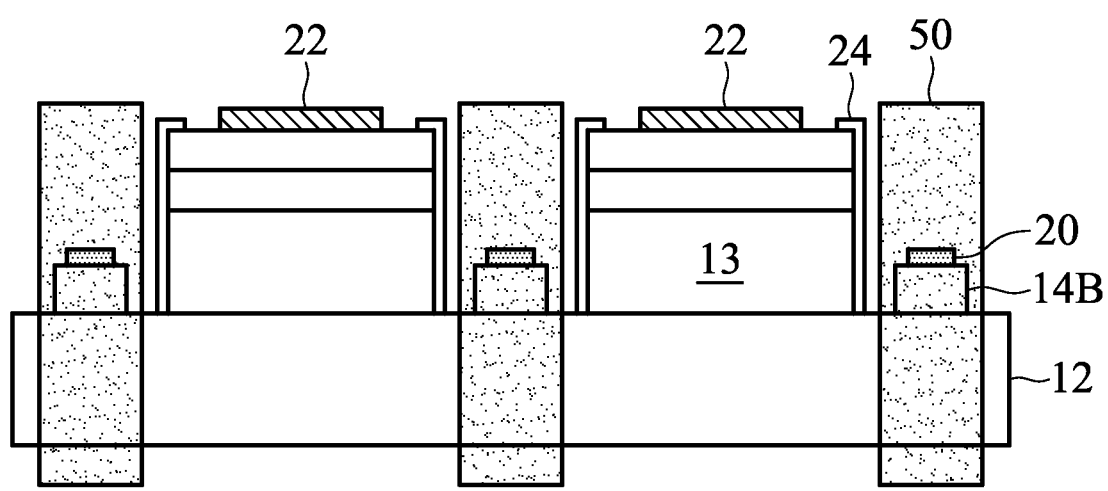

Further, after measuring, as shown in FIGS. 39A and 39B (a cross-section view along the line 1-1' in FIG. 39A), the extended portion 11 of the first semiconductor layer 14 is etched to form a freestanding first semiconductor layer 14B and expose the top surface of the growth substrate 12. Next, a passivation layer 24 is formed to cover at least the sidewall of the light emitting layer 16. The passivation layer 24 can cover the sidewall of the second semiconductor layer 18 and that of the first semiconductor layer 14. The additional step, the using of dry etching, to further etch the first semiconductor layer 14 separates the protruded portion 13 from the freestanding first semiconductor layer 14B. By the step, the sidewalls of the second semiconductor layer 18, of the light emitting layer 16, and of the protruded portion 13 of the first semiconductor layer 14 can be substantially smooth and even. This facilitates the subsequent forming of a smooth passivation layer 24. Furthermore, when dicing the structure into a plurality of individual chip, the width of cutting range 50 can be pre-determined so as to form a light emitting diode chip structure with a growth substrate whose projected area is larger than that of the protruded portion 13 of the first semiconductor layer 14. By leaving a horizontal distance between the sidewall of the protruded portion 13 and the growth substrate 12, the aforementioned scattering of laser beam and the partial decomposition of GaN can be avoid, thus preventing the semiconductor layers from cracking. Finally, as shown in FIGS. 40A and 40B (a cross-section view along the line 1-1' in FIG. 40A), the wafer-level light emitting diode structure is subjected to a scribe process along the cutting ranges 50, to obtain a plurality of light emitting diode chips. Meanwhile, the marked light emitting diodes can be identified and subjected to subsequent processes. The scribe process includes dicing the light emitting diode structure 10 along a cutting range 50, thereby forming a plurality of chips. Since the plurality of chips have been marked, chips with similar photoelectric properties can be selected for further manufacturing processes, such as die attach, LLO, and other packaging steps. For chips that fail to meet the specified bins standard, these chips can be identified well in advance, thus saving the costs and sparing them from subsequent processes which are superfluous.

Figure 16A:
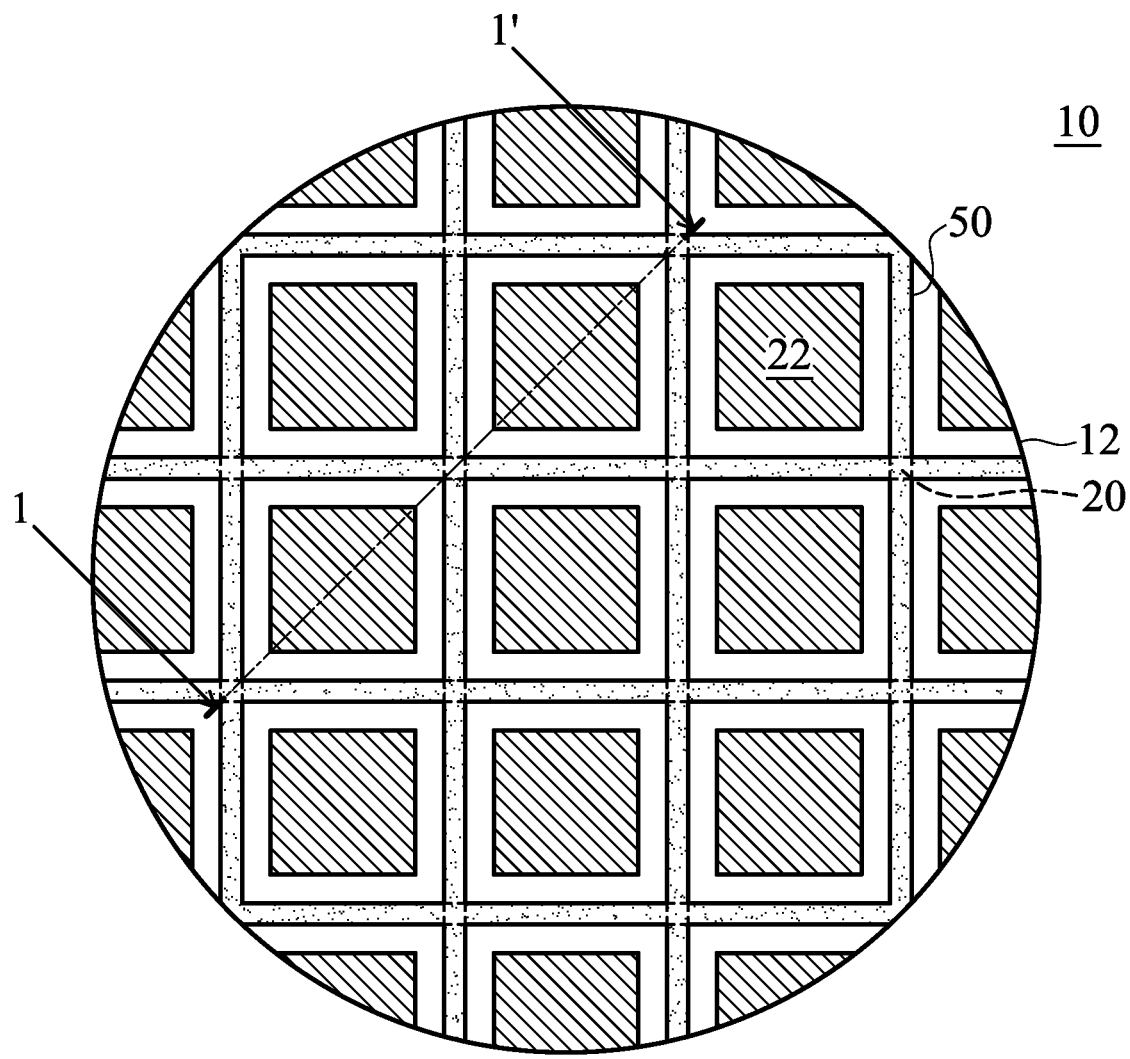
FIGS. 16A, 17A, 18A, 19A, and 20A are top views demonstrating variations of the first electrode in the wafer-level LED structure.
Figure 16B:
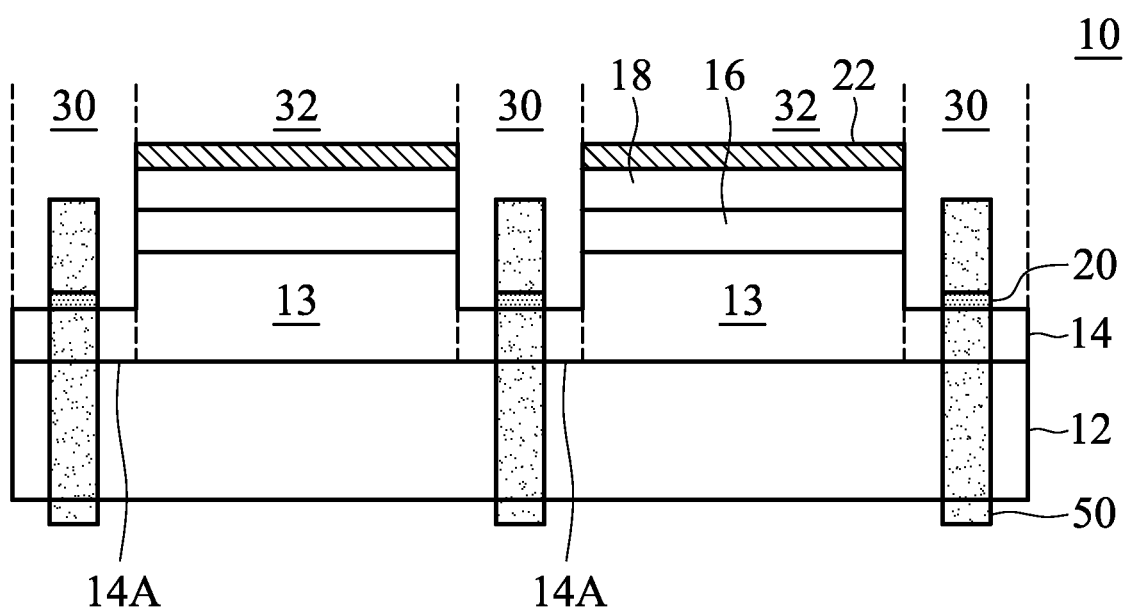
FIGS. 16B, 17B, 18B, 19B, and 20B are cross-sections respectively corresponding to FIGS. 16A, 17A, 18A, 19A, and 20A.
Figure 17A:
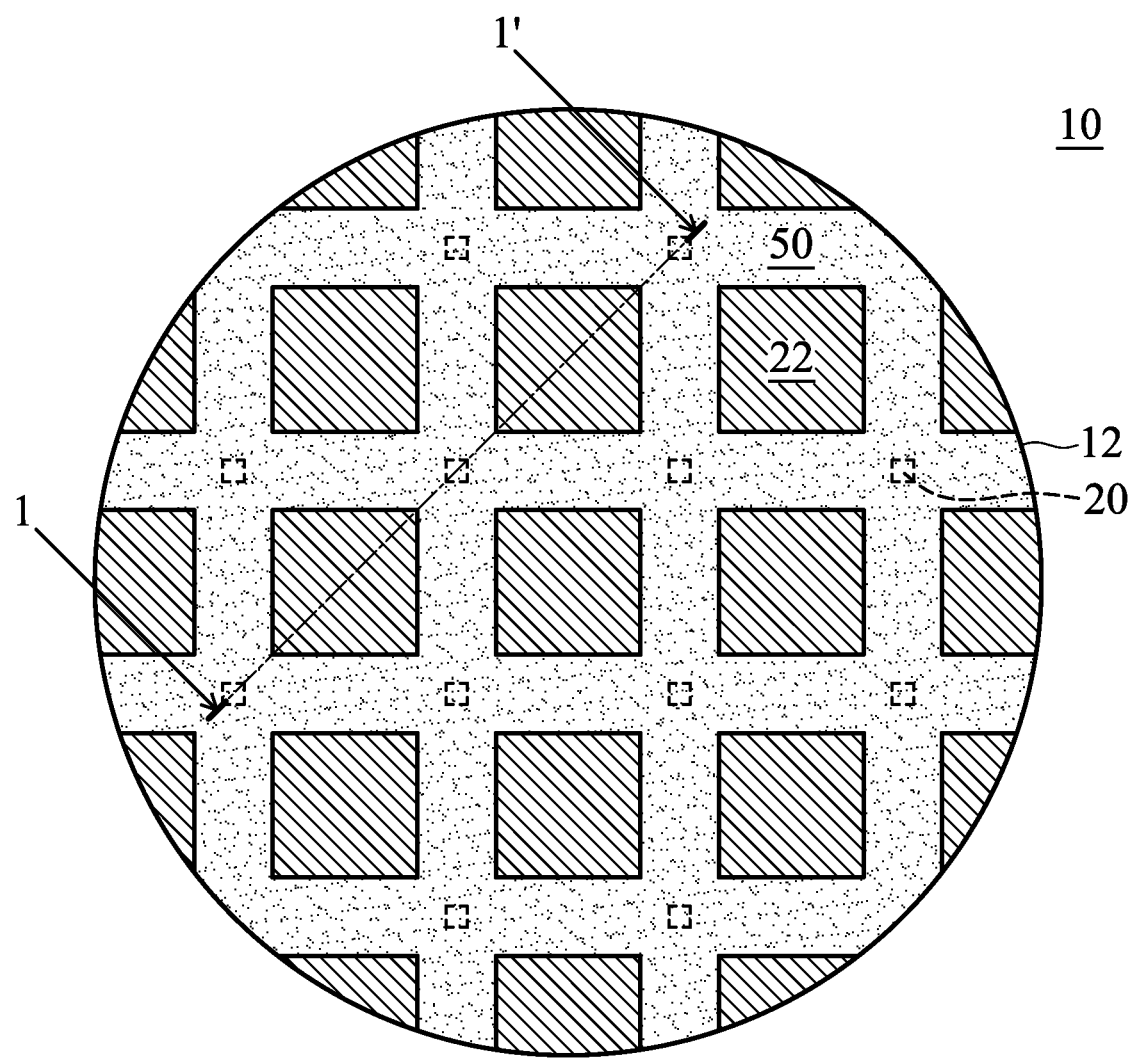
Figure 17B:
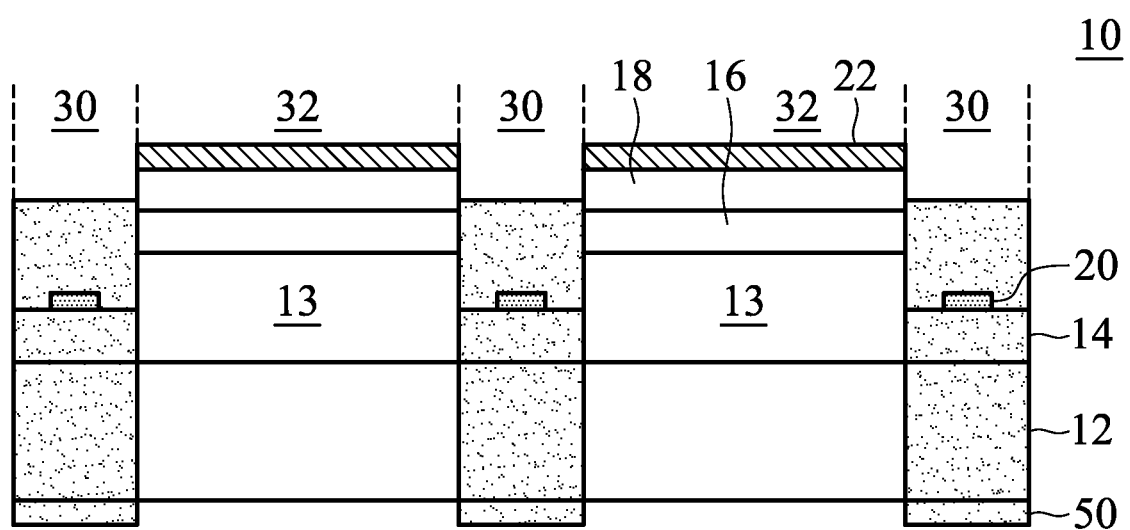

Please refer to FIG. 16A and FIG. 16B, wherein FIG. 16B is a cross-section along line 1-1' of FIG. 16A. After binning (selection), a scribe process is performed to the light emitting diode structure 10. The process includes dicing the light emitting diode structure 10 along a cutting range 50, thereby forming a plurality of chips. Since the plurality of chips have been marked in different levels, chips with similar photoelectric properties can be selected for further manufacturing processes, such as die attach, LLO, and other packaging steps. For chips that fail to meet the specified bins standard, these chips can be identified well in advance, thus saving the costs and sparing them from subsequent processes which are superfluous.

Figure 18A:
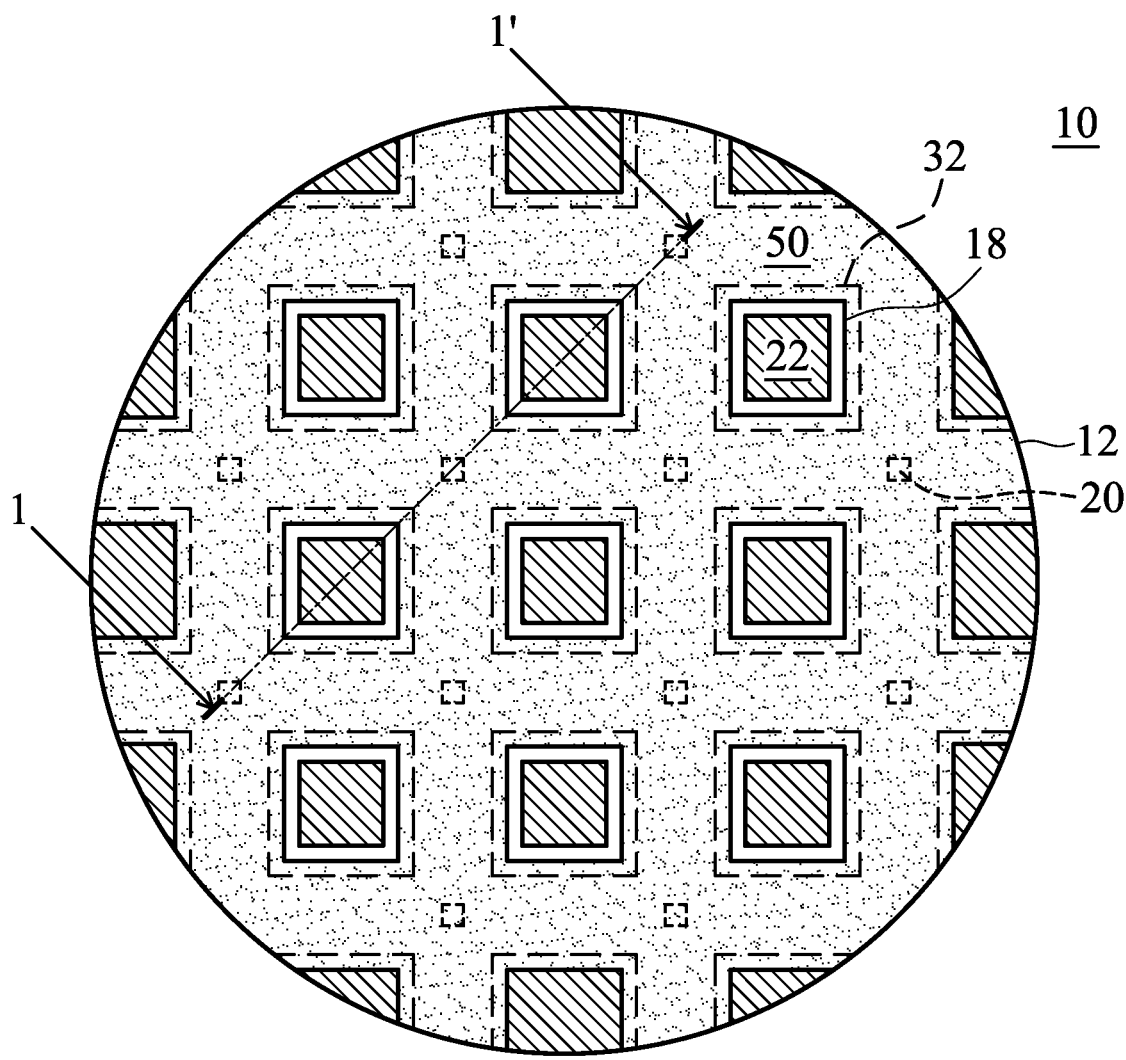
Figure 18B:
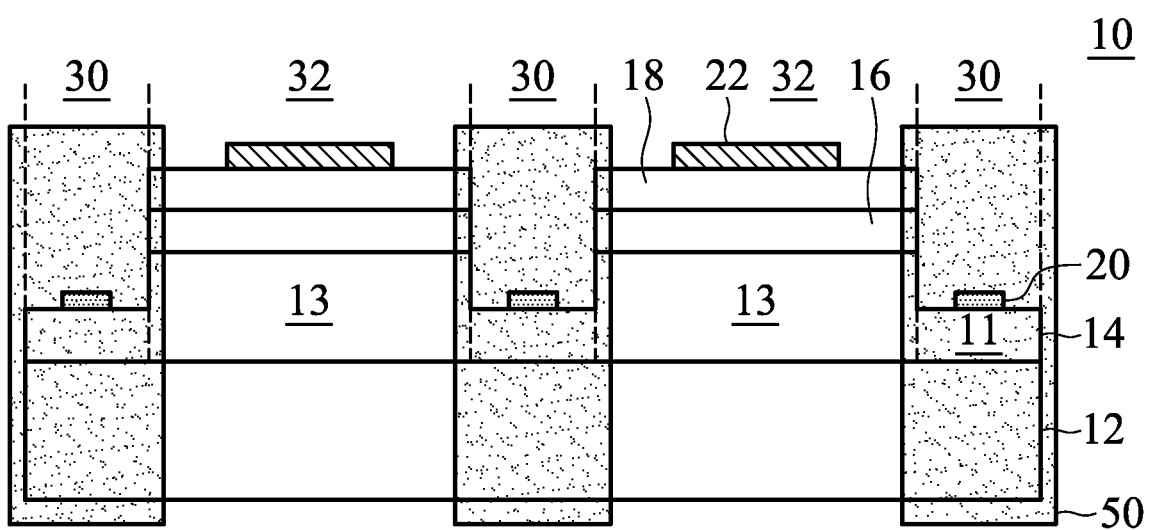

FIGS. 16A-18B demonstrate embodiments of various widths of the cutting range 50. As shown in FIG. 16A and FIG. 16B, the width of cutting range 50 is apparently narrower than that of the first depressed portion 30. When dicing along the cutting range 50, the resultant light emitting diode chips are substantially in inverted T-shape with the residual parts 14A remaining. The residual parts 14A prevent the first semiconductor layer 14 from cracking during the LLO process. In FIG. 17A and FIG. 17B, the width of the cutting range 50 is equal to that of the first depressed portion 30. The width of the cutting range 50 can be larger than that of the first depressed portion 30 as shown in FIG. 18B, a cross-section view along line 1-1' in FIG. 18A.

Figure 19A:
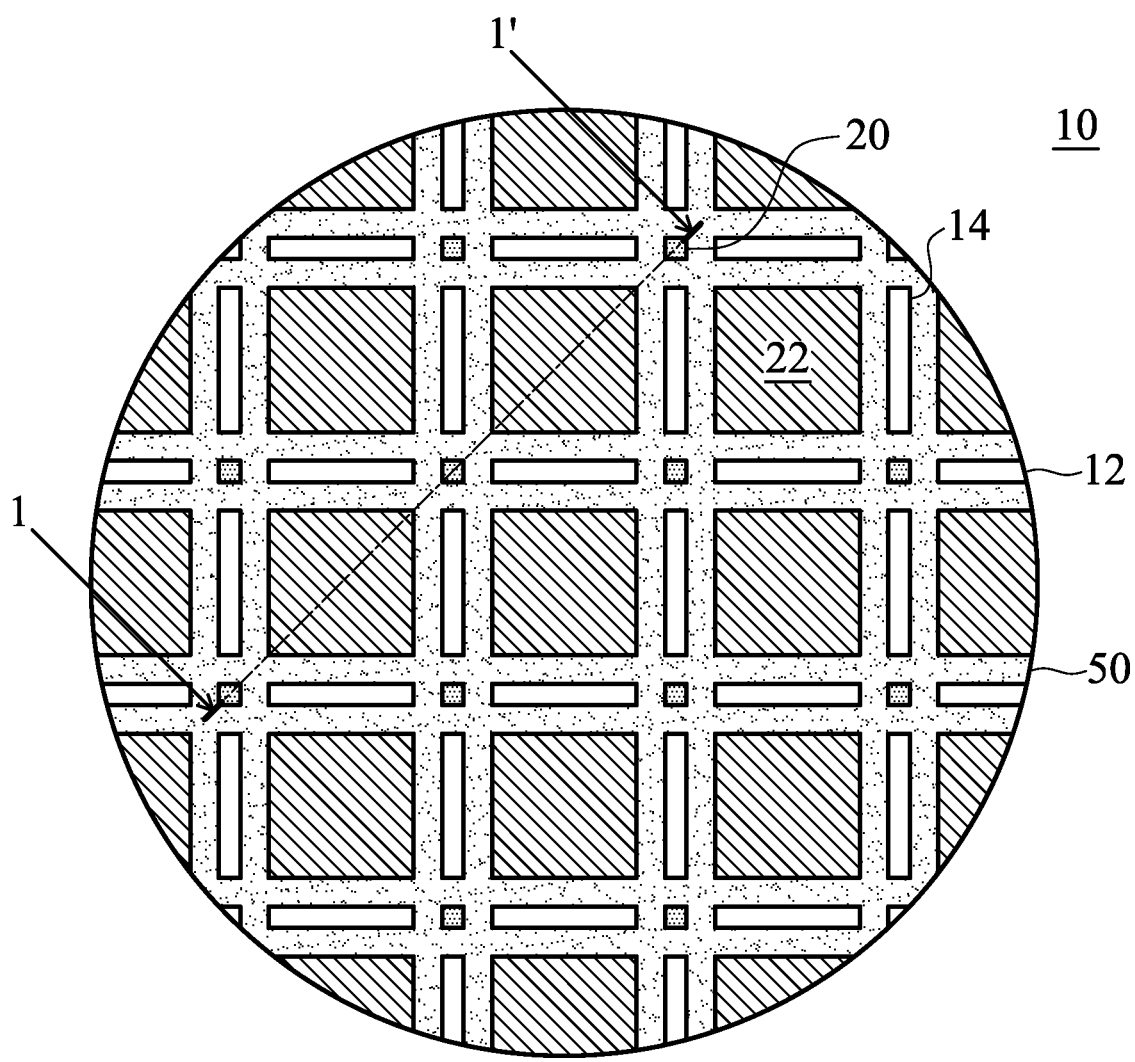
Figure 19B:
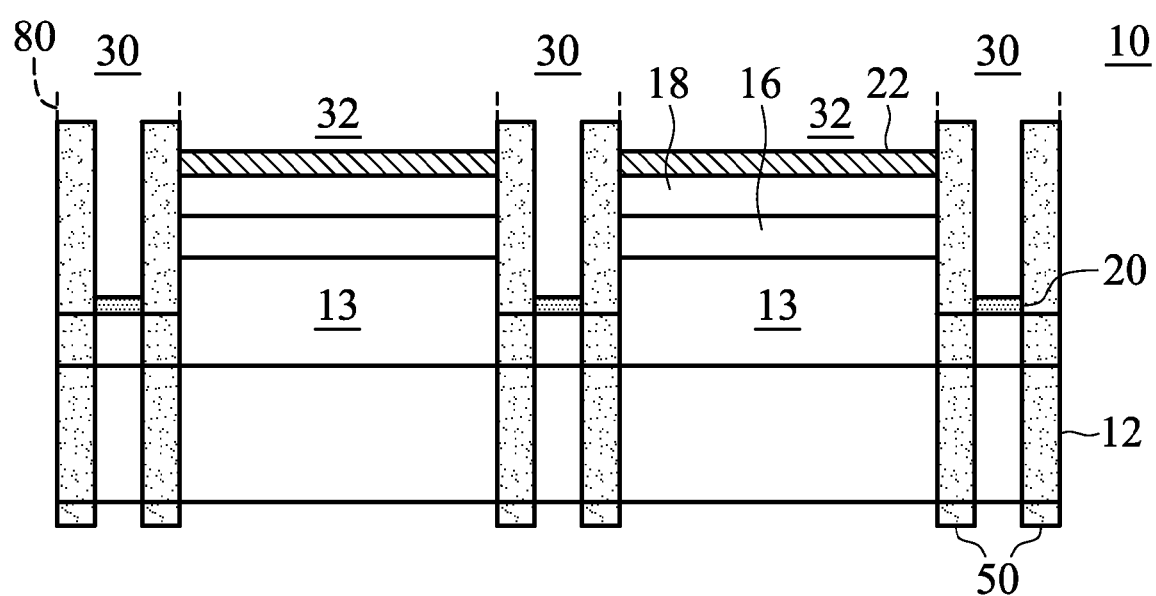

Moreover, referring to FIG. 19A and FIG. 19B, wherein FIG. 19B is a cross-section view along line 1-1' of FIG. 19A. Two cutting ranges 50 can be employed for cutting of a first depressed portion 30, thereby reducing the occurrence of cracks in the first depressed portion 30 after the performing of LLO. In some embodiments, the cutting range 50 can be pre-determined, so that a specific distance exists among second electrodes 22, thereby preventing the chip from contamination by scraps of the second electrodes 22.

Figure 20A:
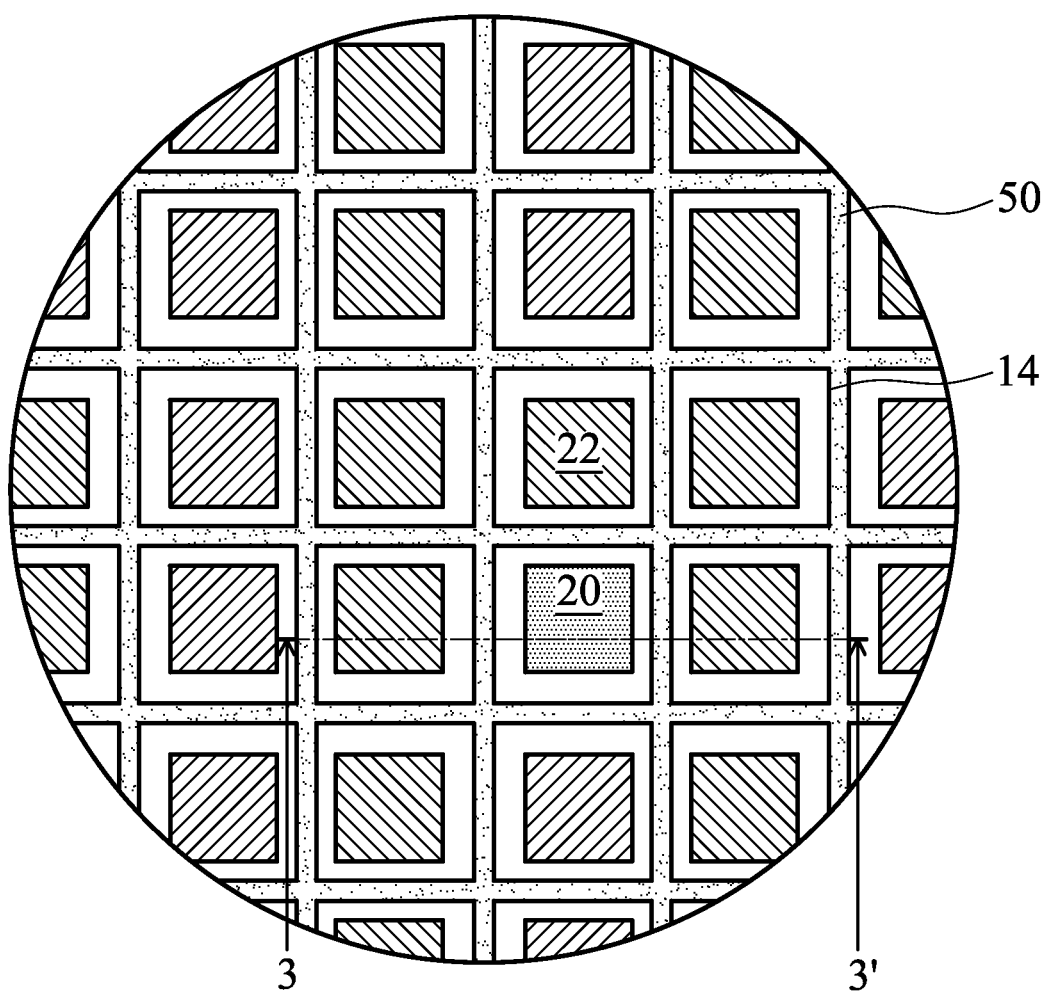
Figure 20B:
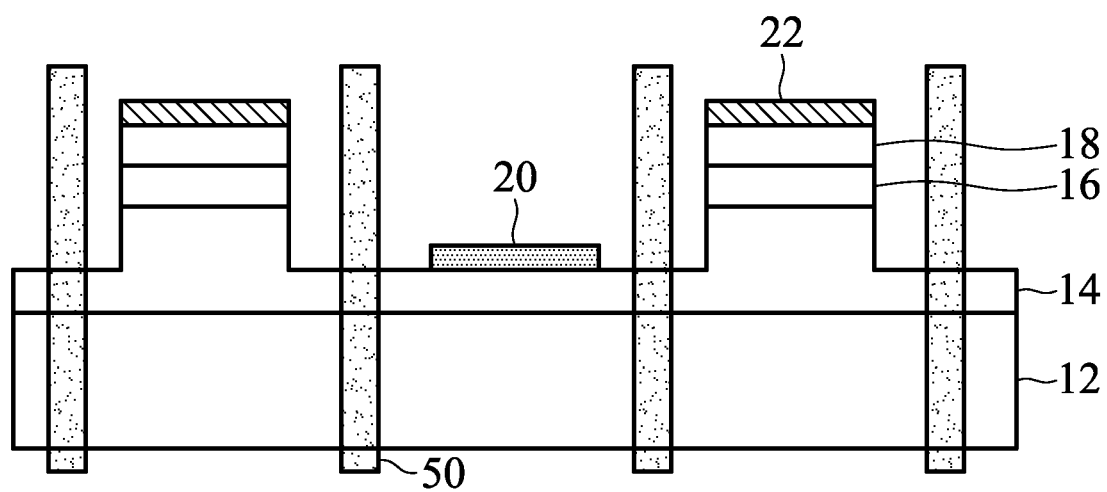

On the other hand, according to other embodiments of the disclosure, the first electrode 20 for measuring current-voltage characteristics and spectral characteristics of the stacked structure 25 (a semiproduct of the chips) can be disposed on a pre-determined area. As shown in FIG. 20B (a cross-sectional view along line 1-1' of FIG. 20A), a pre-determined area can be an area that should have been designed for the deposition of the stacked structure 25. To be more specifically, the forming of the first depression portion 30 can be performed in at least one of the areas that are designed for the deposition of the stacked structure 25. In that pre-determined area, only the first semiconductor layer 14 with the growth substrate 12 remains after the patterning process. The first electrode 20 is then disposed on the surface of the first semiconductor layer 14 located within the pre-determined area. The placement of the first electrode 20 on the pre-determined area spares the need to place the same in the first depression portion 30 overlapping with the cutting range 50. Accordingly, the width of the cutting range 50 can be narrowed down, increasing utilization rate of the growth substrate 12 (i.e. increasing the yield of chips).

Figure 21A:
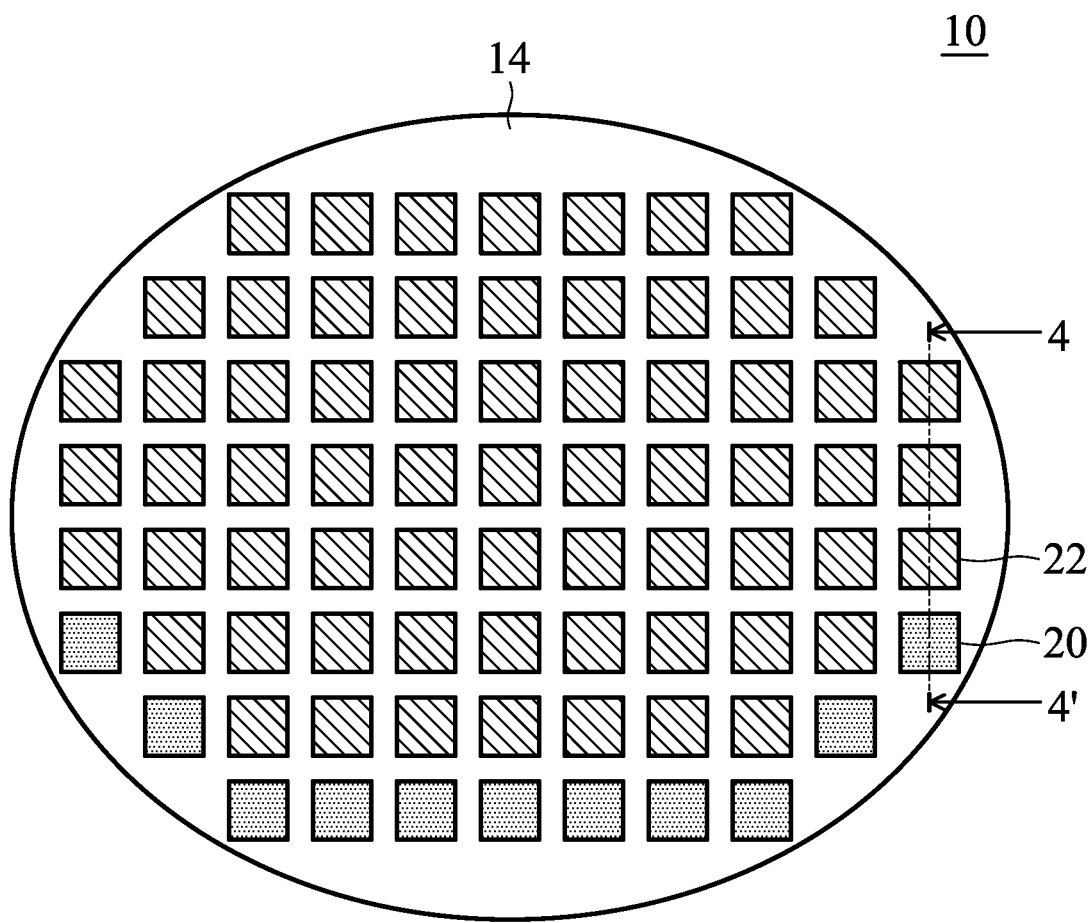
FIG. 21A is a top view of a wafer-level LED structure according to another embodiment of the disclosure.
Figure 21B:
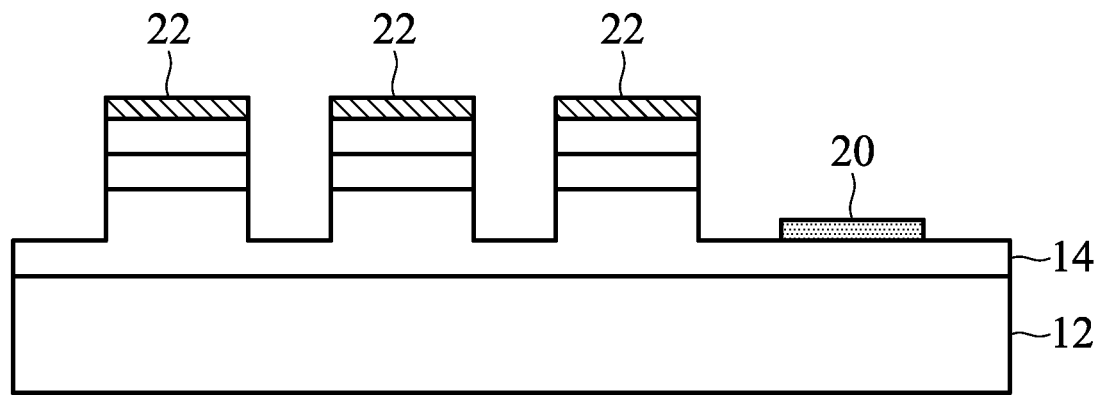
FIG. 21B is a cross-section along the line 4-4' in FIG. 21A.
Figure 22:
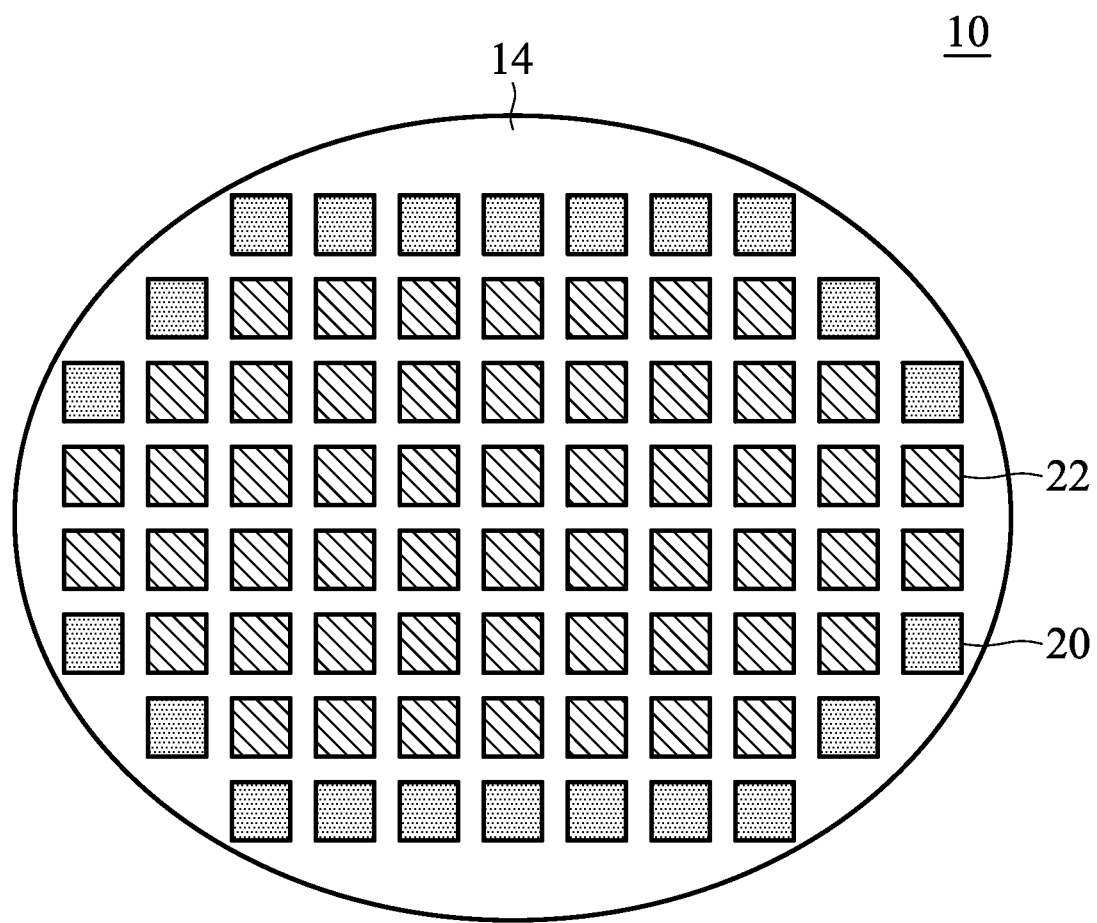
FIGS. 22-25 are top views of wafer-level LED structures according to some embodiments of the disclosure.
Figure 23:
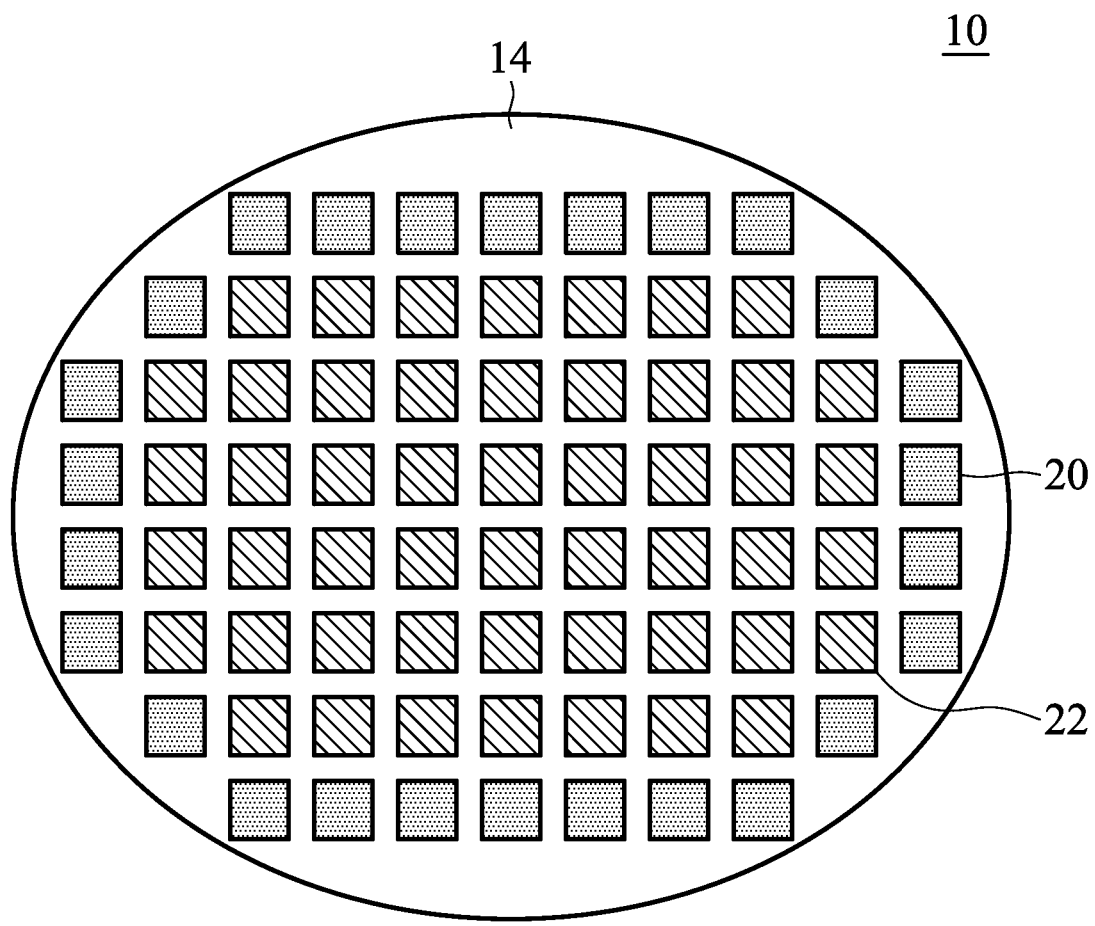
Figure 24:
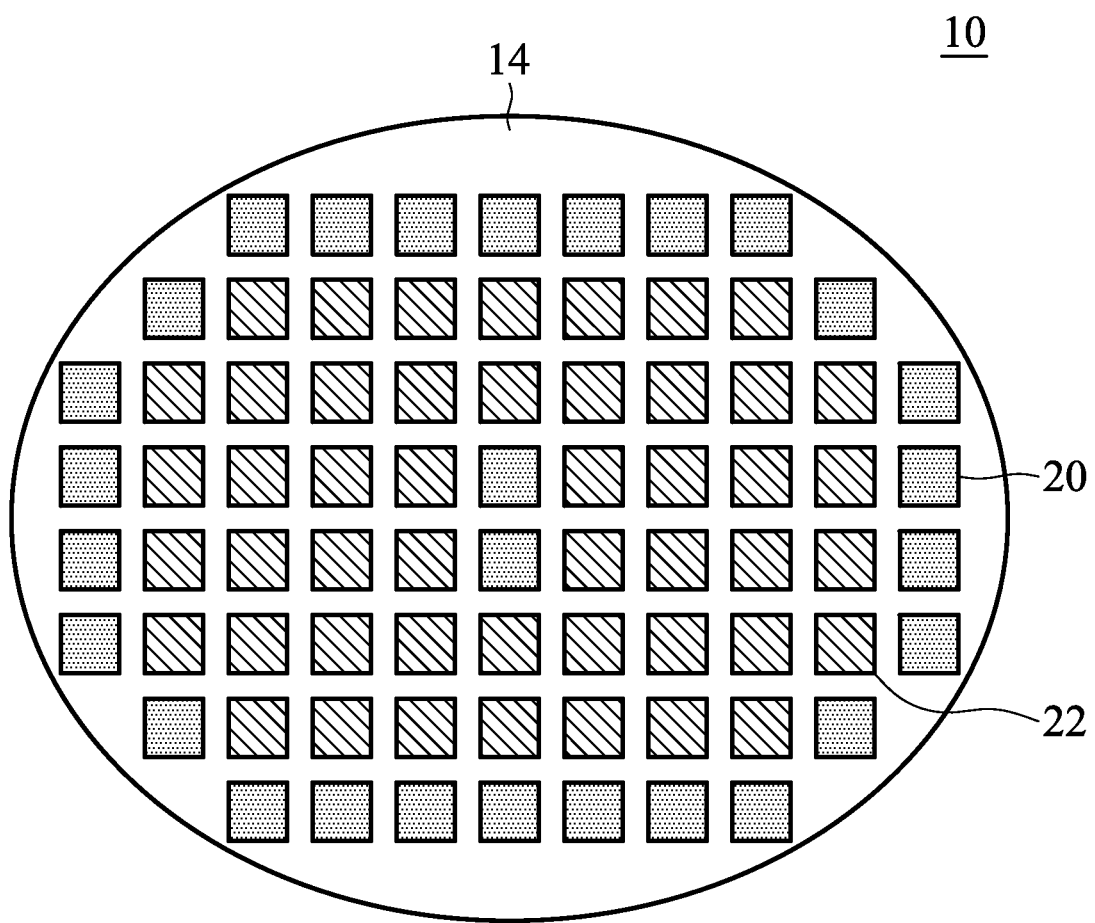
Figure 25:
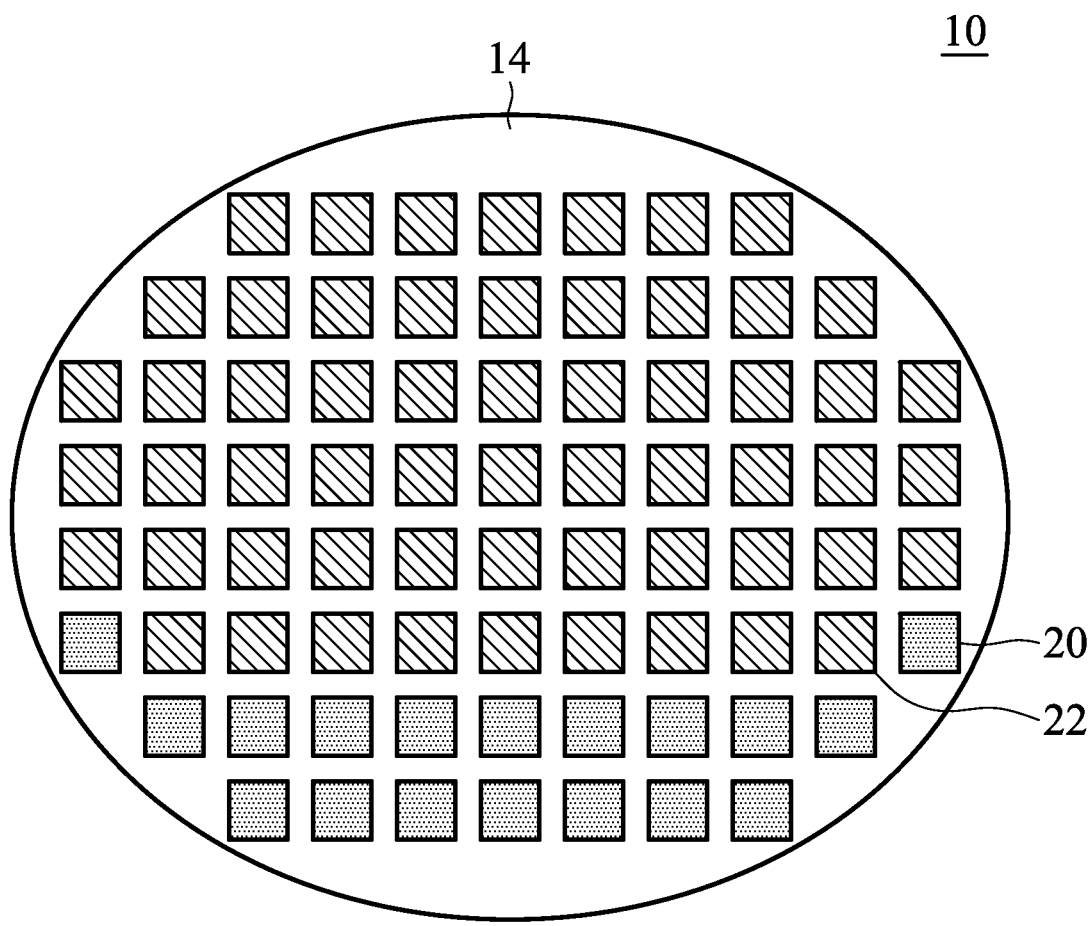

According to an embodiment of the disclosure, as shown in FIG. 21A and FIG. 21B (a cross-sectional view along line 4-4' in FIG. 21A), the first electrode 20 used for measuring photoelectric characteristics of the stacked structure (a semiproduct of the chips) can be disposed on peripheral areas of the semiproduct of the chips. For example, the first electrode 20 can be disposed on one side of the peripheral areas of the wafer, as shown in FIGS. 21A, 22 and 23. Since the peripheral areas are not suitable for forming light emitting diode chips due to the poor electrical characteristics in comparison with the central areas, the first electrodes 20 used for the detecting of photoelectric characteristics of the stacked structure can be disposed on the peripheral areas of the wafer so as to increase the utilization rate of the wafer. Moreover, in order to double check the photoelectric characteristics of the stacked structure, the first electrodes 20 can be disposed on the peripheral areas and the central area as well, as shown in FIG. 24. In other embodiments, in order to enhance fabrication through put, the first electrodes 20 can be disposed on the peripheral areas of the wafer, such as through a multi-layered first electrode disposition, as shown in FIG. 25).

The first electrode 20, such as an N-type contact pad, can be formed on the first semiconductor layer 14 formed of a N-type semiconductor layer so as to form an Ohmic contact layer therebetween. Meanwhile, there may be an Ohmic contact layer formed between the first electrode 20 made of a P-type contact pad and the first semiconductor layer 14 from of a P-type semiconductor layer.

Further, the second electrode 22 (such as a P-type contact pad) can include a P-type Ohmic contact and further include an N-type Ohmic contact layer for saving a process step. Moreover, according to another embodiment of the disclosure, since the P-type semiconductor layer can provide a tunneling-effect to facilitate N-type Ohmic contact, the first electrode 20 (such as an N-type contact pad) and the second electrode 22 (such as a P-type contact pad) both have an N-type Ohmic contact layer, but do not have a P-type Ohmic contact layer.

According to some embodiments of the disclosure, the semiproduct of the light emitting diode chip having a second electrode 22 can be designed to have a flip chip structure. Therefore, the first electrode 20 (such as an N-type contact pad) can be used to bond with a bonding layer of a carrier substrate instead of serving as a test element, increasing utilization rate of the substrate (such as a wafer).

Figure 26A:
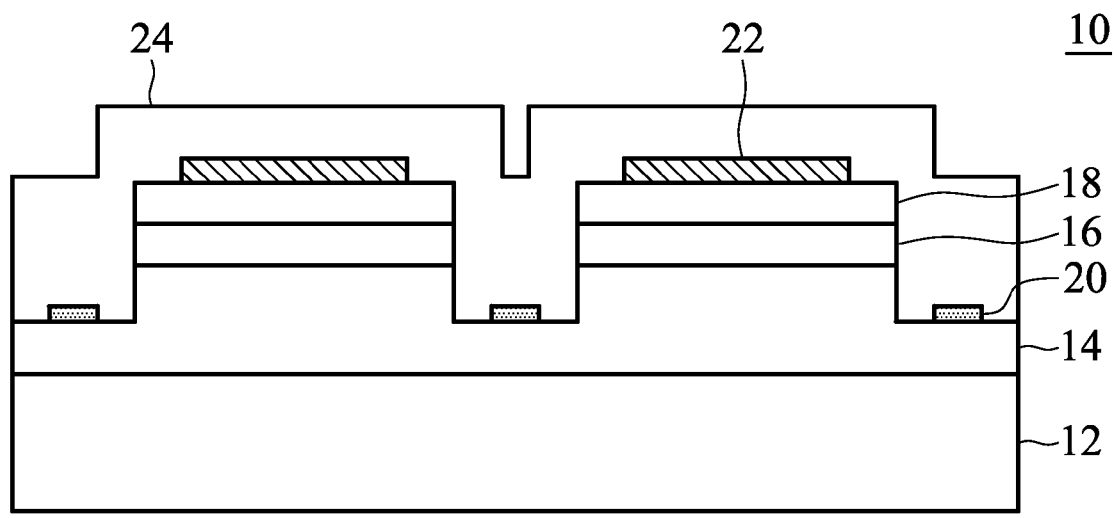
FIG. 26A-26D are a series of cross-sections showing a method for fabricating a LED chip according to an embodiment of the disclosure.
Figure 26B:
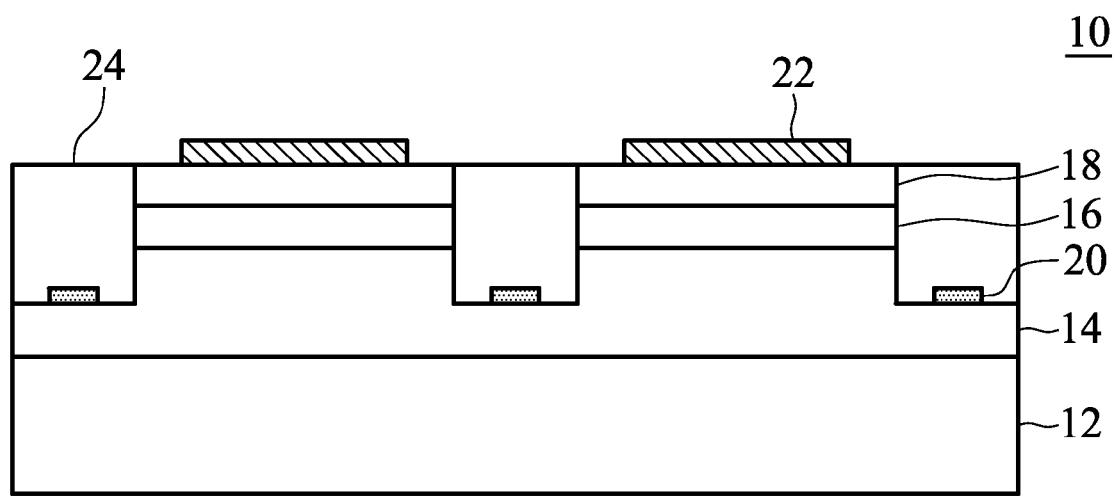

According to some embodiments of the disclosure, after the inspection of photoelectric characteristics, a passivation layer 24 can be further disposed on the growth substrate 12, and a planarization process (such as chemical mechanical planarization) can be performed to the passivation layer 24 to remove a part of the passivation layer 24 and expose the second electrode 22, as shown in FIG. 26A and FIG. 26B.

Figure 26C:
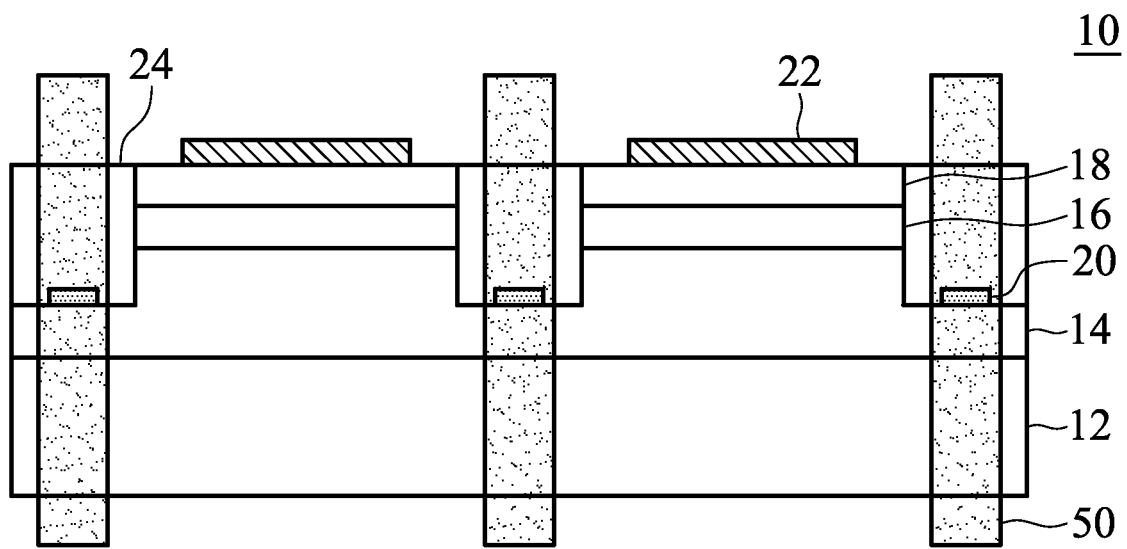
Figure 26D:
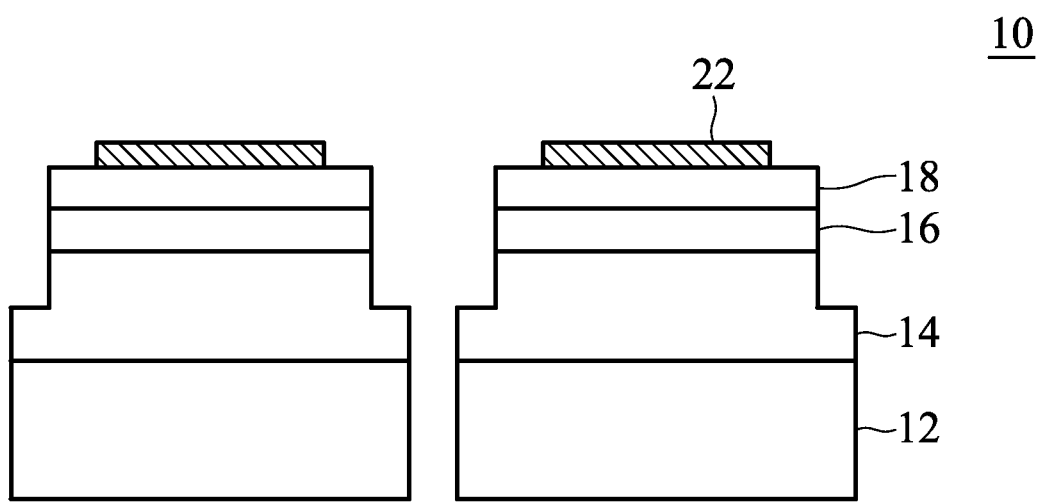

Next, the substrate is cut along the cutting range 50, as shown in FIG. 26C. In this step, the passivation layer 24 can protect the stacked structure from damage during the cutting process. Finally, a light emitting diode chip 100 is obtained, as shown in FIG. 26D. The remaining portion of the passivation layer 24 covers sidewalls of the first semiconductor layer 14, of the light emitting layer 16, and of the second semiconductor layer 18. Therefore, the reliability of the stacked structure can be ensured during subsequently processes. In an embodiment of the disclosure, the remaining passivation layer 24 can be optionally removed as well.

Figure 27A:
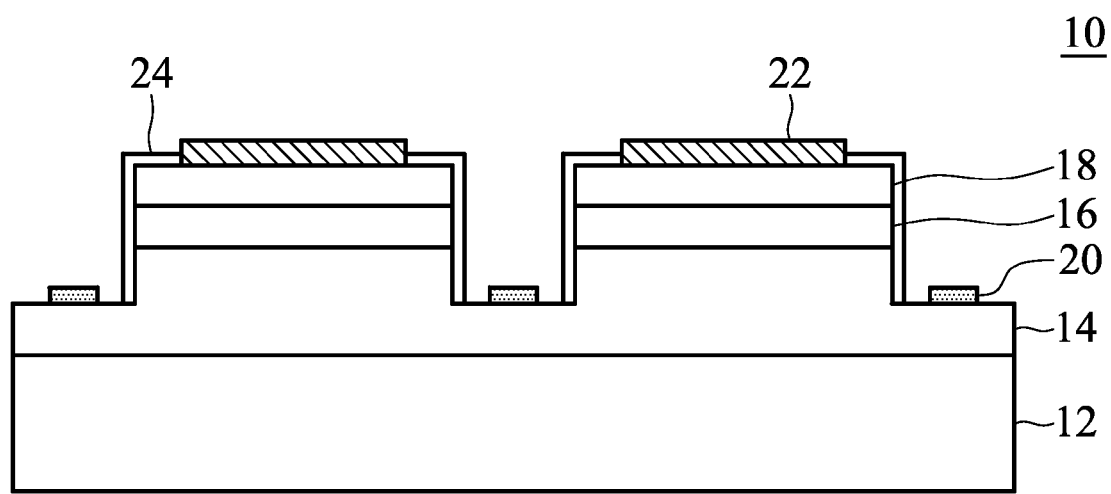
FIG. 27A-27C are a series of cross-sections showing a method for fabricating a LED chip according to another embodiment of the disclosure.
Figure 27B:
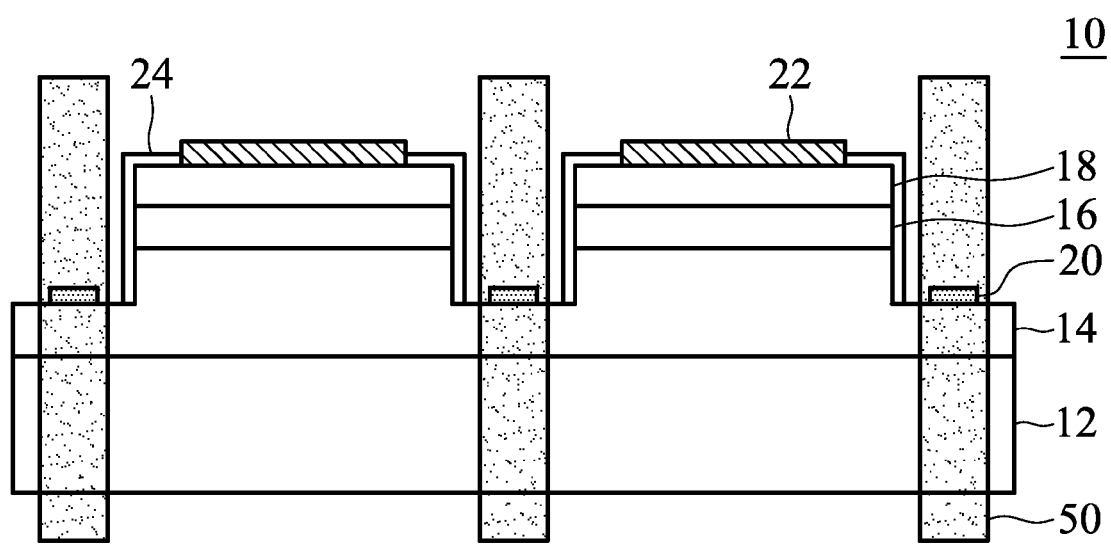
Figure 27C:
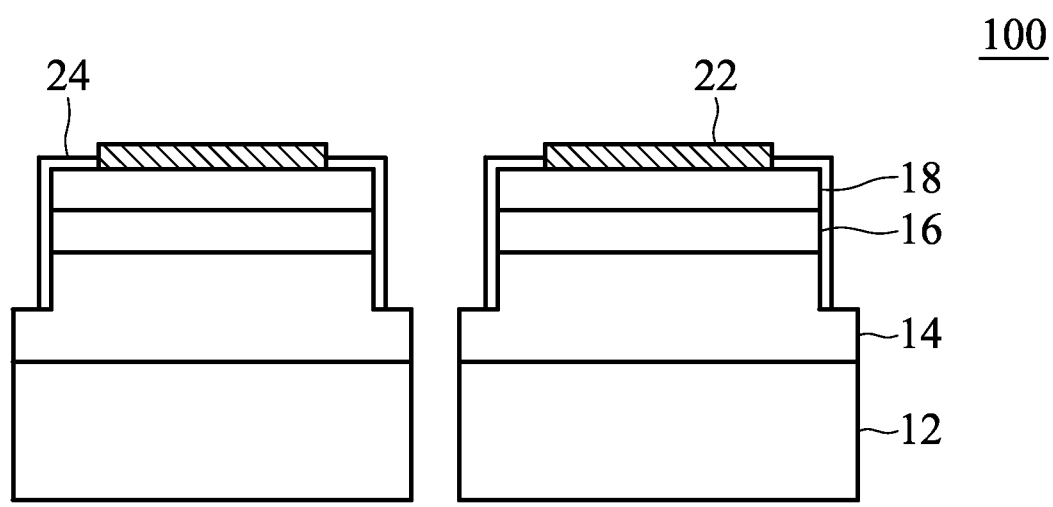

According to another embodiment of the disclosure, after inspection of photoelectric characteristics, a passivation layer 24 can be formed on the top surface of the second semiconductor layer 18, and at least sidewall of the light emitting layer 16 so as to prevent current leakage. If the passivation layer 24 is disposed on the top surface of the first semiconductor layer 14, the passivation layer 24 disposed within the cutting range 50 can be removed. Therefore, the cutting-tool will not directly pass through the passivation layer 24 during the cutting process. Alternatively, the passivation layer 24 can be formed on the growth substrate 12 outside of the cutting range, as shown in FIG. 27A. Therefore, the cutting-tool will not directly pass through the passivation layer 24 during the cutting process (as shown in FIG. 27B), to obtain the light emitting diode chip (as shown in FIG. 27C).

Figure 28:
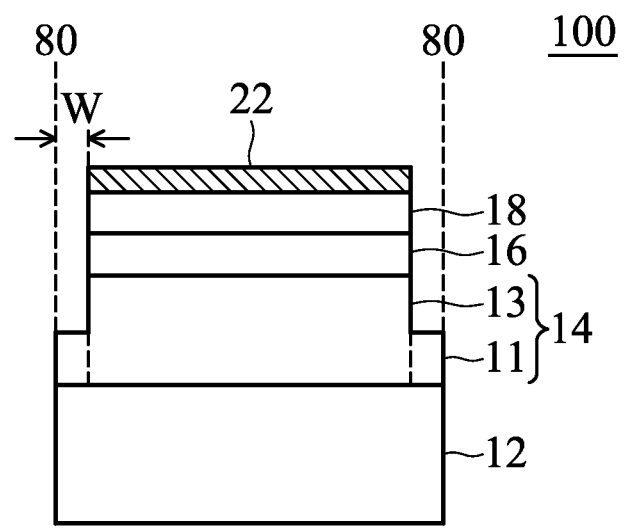
FIGS. 28-35 are cross-sections of the LED chips according to various embodiments of the disclosure.

FIG. 28 illustrates a cross-sectional view of a light emitting diode chip 100 by using the cutting method described in FIG. 16B. The light emitting diode chip 100 includes a growth substrate 12 having a boundary 80. A first semiconductor layer 14 having a protruded portion 13 and an extended portion 11 is on the growth substrate 12. A light emitting layer 16 overlies the protruded portion 13 of the first semiconductor layer 14. A second semiconductor layer 18 again overlies the light emitting layer 16. It should be noted that the resultant light emitting diode chips 100 obtained from the previously mentioned method may be composed of one electrode 22 (i.e. a positive or negative electrode). The electrode 22 may be disposed on the second semiconductor layer 18.

Figure 29:
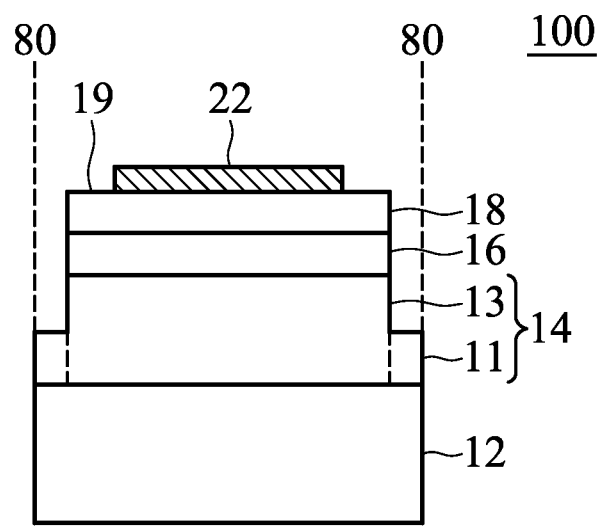

According to another embodiment of the disclosure, a minimum horizontal space W between the second electrode 22 and the boundary 80 of the growth substrate 12 may be at least about 3 μm or more, or preferably, at least about 10 μm or more. The second electrode 22 of the light emitting diode chip 100 is disposed on a part of the second semiconductor layer 18, exposing a part of the top surface 19 of the second semiconductor layer 18, as shown in FIG. 29. Particularly, the relative area between the second electrode 22 and the second semiconductor layer 18 occupies at least about 30% of the surface area of the top surface 19 of the second semiconductor layer 18.

Figure 30:
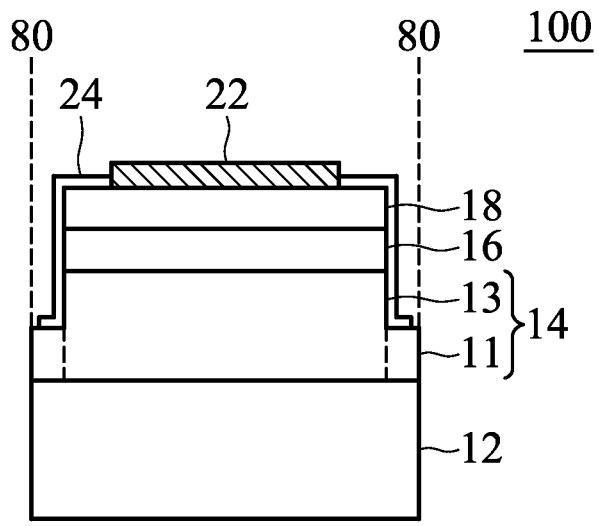

In addition, the light emitting diode chip 100 may further include a passivation layer 24 formed on the exposed top surface 19 of the second semiconductor layer 18 and further extended to cover the sidewall of the second semiconductor layer 18, of the light emitting layer 16, and of the protruded portion 13 of the first semiconductor layer 14 as shown in FIG. 30. Furthermore, the passivation layer 24 may be further extended to the top surface of the extended portion 11 of the first semiconductor layer 14. Since the passivation layer 24 covers a part of the top surface of the second semiconductor layer 18, the sidewall of the second semiconductor layer 18, of the light emitting layer 16, and of the first semiconductor layer 14, the light emitting diode chip 100 is protected from damage during subsequent processes and the problem of current leakage can be avoided.

Additionally, the second electrode 22 of the light emitting diode chip 100 may include a reflective layer 21 and a bonding metal layer 23, wherein the reflective layer 21 can be spaced apart from the passivation layer 24, leaving a gap G, a for the reflective layer in case of silver diffusion. The bonding metal layer 23 covers the reflective layer 21 completely and covers a part of the passivation layer 24, as shown in FIG. 31. The passivation layer 24 may be optionally waived if the bonding metal layer 23 has an area that is less than that of the top surface 19 of the second semiconductor layer 18. In this case, the bonding metal layer 23 will not overflow to get in touch with the sidewall of the stacked structure, thus, hindering electrical short circuiting. It should be noted that, in some embodiments of the disclosure, if the sidewall of the stacked structure is covered with a passivation layer 24, the area of the bonding metal layer 23 is not confined to be smaller than that of the second semiconductor layer 18.

Figure 32:
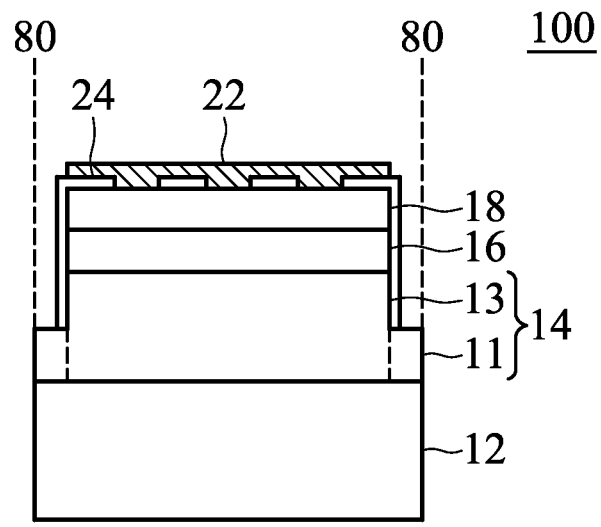
Figure 33:
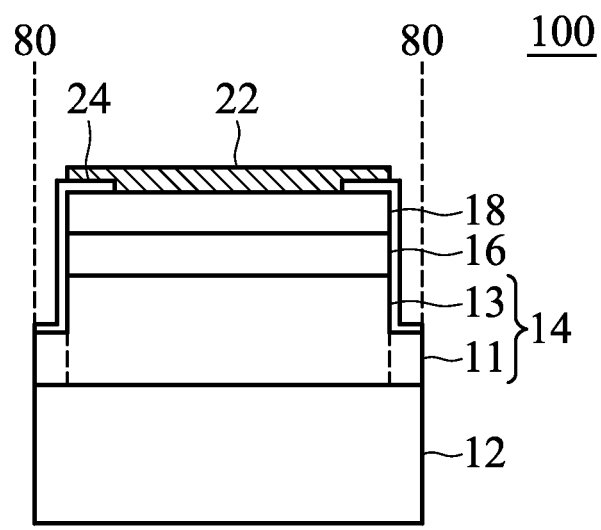
Figure 34:
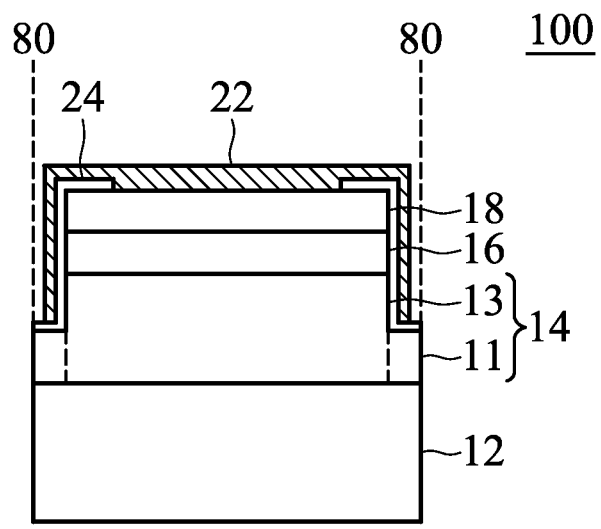

The passivation layer 24 can be a patterned passivation layer and be disposed between the second semiconductor layer 18 and the second electrode 22. A portion of the second semiconductor layer 18 exposed by the patterned passivation layer 24 directly contacts with the second electrode 22, thus forming a current-improved structure, as shown in FIG. 32. In this embodiment, the passivation layer 24 could be extended to cover the sidewall of the second semiconductor layer 18, of the light emitting layer 16 and of the first semiconductor layer 14. Furthermore, the passivation layer 24 may be further extended to the top surface of the extended portion 11 of the first semiconductor layer 14, as shown in FIG. 33. In other embodiments, the second electrode 22 may be extended onto the passivation layer 24, and the second electrode 22 is separated from the light emitting layer 16 and the first semiconductor layer 14 by the passivation layer 24, as shown in FIG. 34. By this construction, the sidewall of the stacked structure is further firmly protected by the passivation layer 24 and the extended second electrode 22. The cracking of semiconductor layers during LLO can be avoided.

Figure 35:
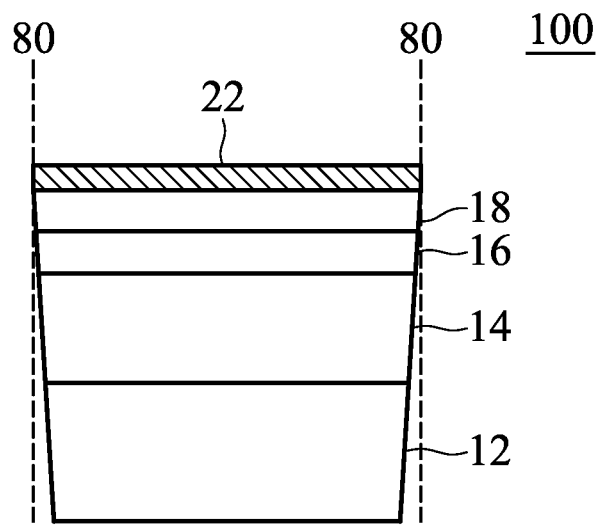

In addition, according to another embodiment of the disclosure, as shown in FIG. 35, the light emitting diode chip 100 may have a tapered sidewall 14 which tapers toward the growth substrate 12. The tapered sidewall of the stacked structure reduces the chance of total internal reflection and helps to improve light extraction efficiency.

Figure 36:
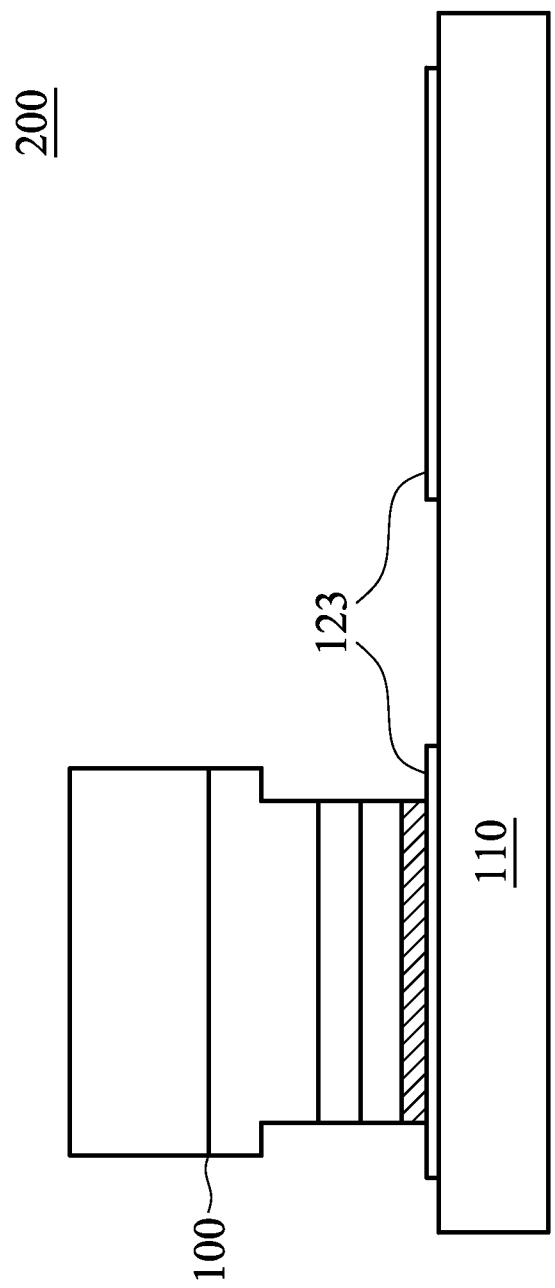
Figure 37:
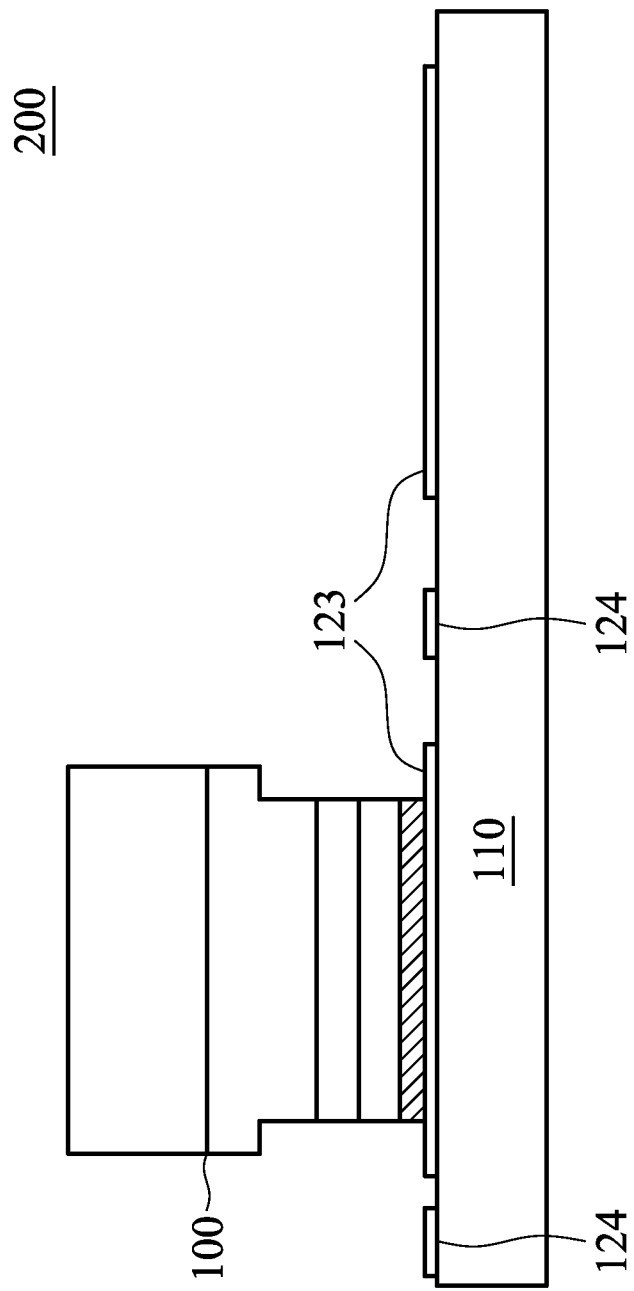

In other embodiments, the light emitting diode chip 100 can be further bonded with a carrier substrate, such as a sub-mount 110 having a contact pad 123 to bond with the light emitting diode chip 100 so as to form a light emitting diode package structure 200, as shown in FIG. 36. The carrier substrate can be a packaging substrate or module board as well, sparing the use of sub-mount as an intermediate support for the stacked structure. In addition to the contact pads 123, the sub-mount 110 can further include a contact pad 124 to electrically connect to a subsequently formed electrode of the light emitting diode chip 100 (not shown), as shown in FIG. 37.

Moreover, the light emitting diode chip 100 can be bonded with a package substrate 120 (having circuits 125), to form a semiproduct light emitting diode package structure 200, as shown in FIG. 38. Chip processes, such as LLO of the growth substrate, surface roughness on the surface of semiconductor layer and electrodes and pads deposition, or packaging process (wire bonding or phosphor coating) can be further performed on the semiproduct light emitting package structure 200.

A light emitting diode chip obtained from traditional saw dicing tends to result in jagged sidewalls of the stacked structure and of the growth substrate. Multiple protrusions and indents in the sidewall of the stacked structure after dicing makes it difficult to lay a smooth passivation layer over them. In the worst-case, the passivation layer laid over the jagged sidewall breaks into segments, partially and disconnectedly covering the jagged sidewall of the stacked structure. If a transparent conductive film (TCL), such as Indium Tin Oxide (ITO) is needed for conducting electricity, the segments of passivation layer together with the TCL will result in current leakage or short circuiting of the light emitting diode chip. The indented sidewall of the growth substrate can have drawbacks as well. When peeling off the growth substrate, laser beam will be used to apply onto the interface between the semiconductor layer and the growth substrate. The indentations in the sidewall of the growth substrate cause the scattering of laser beam so that the decomposition of gallium and nitride is hindered. Therefore, the peeling of growth substrate leads to cracking of the semiconductor layers. Solutions to these drawbacks are vital to the yield rate of LED chips.

Figure 41:
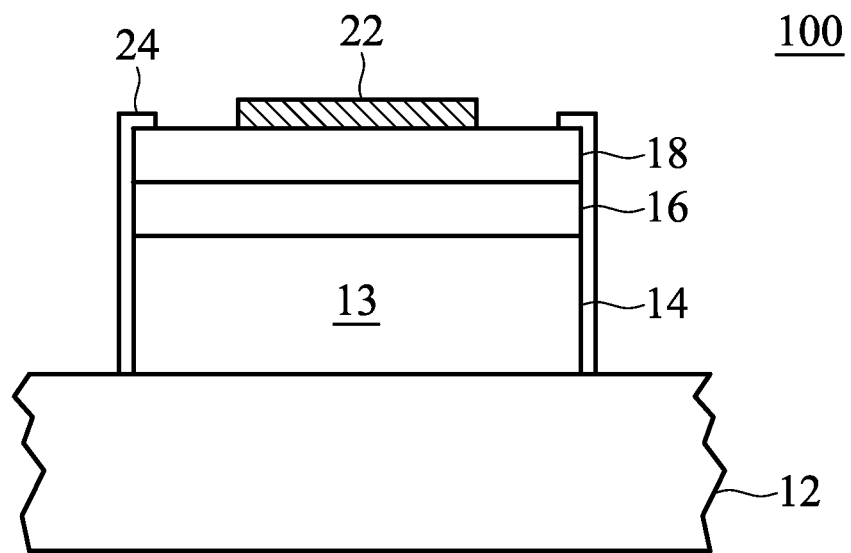
FIGS. 41-43 are cross-sections of LED chips according to some embodiments of the disclosure.

FIG. 41 illustrates a cross-section view of the light emitting diode chip 100 obtained by using the cutting method described in FIG. 40B. As shown in FIG. 41, even though the light emitting diode chip 100 has a growth substrate 12 with a jagged sidewall after dicing, the laser beam (during the LLO process) can still be applied directly to the interface between the growth substrate 12 and the protruded portion 13 of the first semiconductor layer 14, since the protruded portion 13 has a smaller projected area than that of the growth substrate 12. Therefore, laser beam scattering can be avoided during the LLO process. Furthermore, since the protruded portion 13 is separated from the extended portion 11 of the first semiconductor layer 14, a passivation layer 24 completely covering the sidewalls of the second semiconductor layer 18, of the light emitting layer 16, and of the protruded portion 13 of the first semiconductor layer 14 is possible. The resultant chip greatly averts the problem of current leakage.

Figure 42:
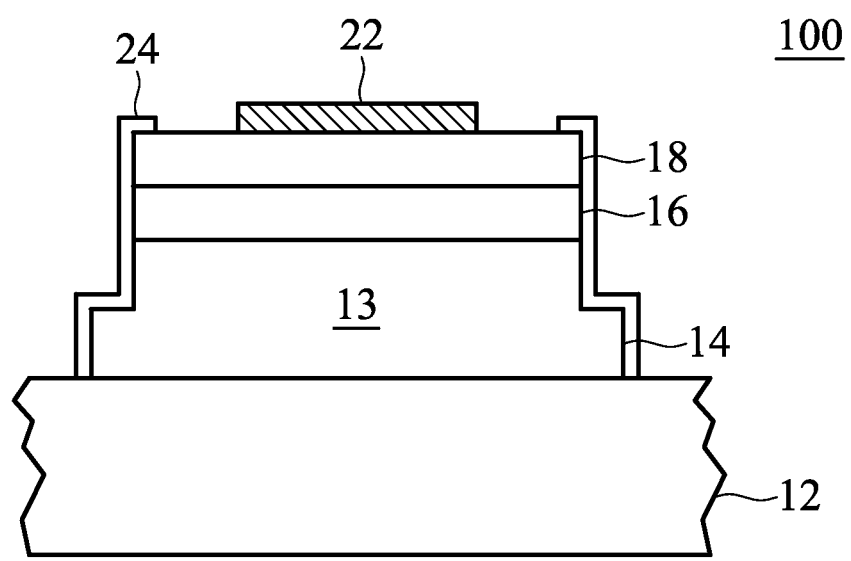

Further, since the cutting range can be pre-determined, the resultant light emitting diode chip structure, especially the protruded portion 13 can be in a ladder-shaped structure, as shown in FIG. 42. The ladder-shaped sidewall of the protruded portion 13 is beneficial to the light extraction efficiency. According to an embodiment of the disclosure, when the bottom surface of the second electrode 22 has an area that is less than that of the top surface of the second semiconductor layer 18, a passivation layer 24 may be waived, since the melted second electrode 22 when bonding with a carrier substrate would not overflow to get in touch with the sidewall of the stacked structure.

Figure 43:
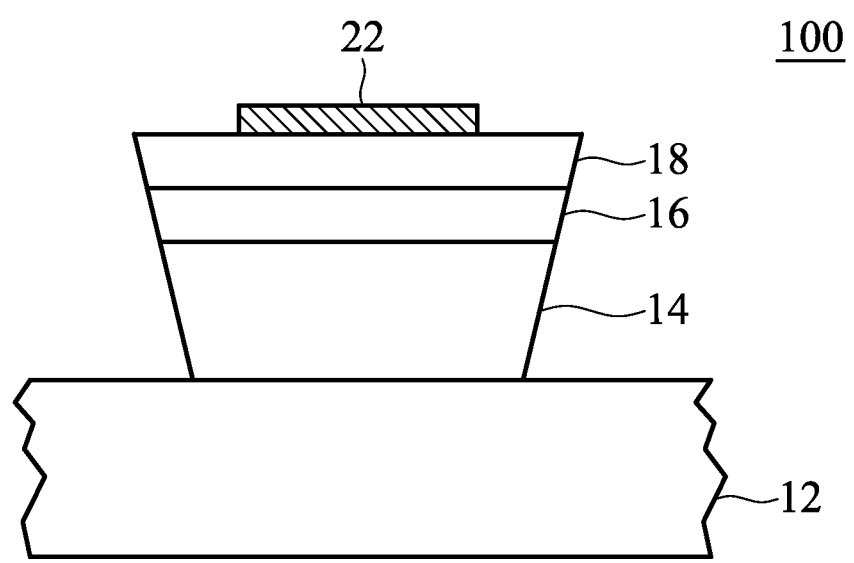

According to some embodiments of the disclosure, as shown in FIG. 43, the light emitting diode chip 100 can have a tapered sidewall which tapers toward the growth substrate 12 as mentioned previously.

Accordingly, in order to solve the aforementioned problems, the disclosure provides a wafer-level light emitting diode structure, a light emitting diode chip and methods for fabricating the same, having increased yield and reduced production costs.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a wafer-level light emitting diode structure, comprising:
   providing a growth substrate, wherein a first semiconductor layer, a light emitting layer, and a second semiconductor layer are sequentially disposed on the substrate;
   subjecting the first semiconductor layer, the light emitting layer, and the second semiconductor layer with a patterning process to form a plurality of first portions and a plurality of second portions, wherein each of the plurality of second portions has a stacked structure and each of the plurality of first portions has an extended portion of the first semiconductor layer, wherein the plurality of first portions overlap with predetermined cutting ranges;
   forming an first electrode on the extended portion of the first semiconductor layer in each of the plurality of first portions;
   forming a second electrode on the stacked structure in each of the plurality of second portions;
   measuring a current-voltage characteristic of the wafer-level light emitting diode structure via the first electrode and the second electrode; and
   cutting the growth substrate along the predetermined cutting ranges, thus removing each first electrode and obtaining a plurality of light emitting diode chips.

2. The method for fabricating the wafer-level light emitting diode structure as claimed in claim 1, before cutting the growth substrate along the predetermined cutting ranges, further comprising:
   measuring a driving voltage of the wafer-level light emitting diode structure via the first electrode and the second electrode.

3. The method for fabricating the wafer-level light emitting diode structure as claimed in claim 1, before cutting the growth substrate along the predetermined cutting ranges, further comprising:
   measuring a spectrum characteristic of the wafer-level light emitting diode structure via the first electrode and the second electrode.

4. The method for fabricating the wafer-level light emitting diode structure as claimed in claim 1, before cutting the growth substrate along the predetermined cutting ranges, further comprising:
  classifying or marking the wafer-level light emitting diode according to a result of the step of measuring the current-voltage characteristic of the wafer-level light emitting diode structure.

5. The method for fabricating the wafer-level light emitting diode structure as claimed in claim 4, before cutting the growth substrate along the predetermined cutting ranges, further comprising:
  forming a passivation layer to cover a side wall of the patterned second semiconductor layer, a side wall of the patterned emitting layer, and a side wall of the patterned first semiconductor layer.

6. The method for fabricating the wafer-level light emitting diode structure as claimed in claim 4, wherein a width of the each predetermined cutting range is less than or equal to the first portion.

7. The method for fabricating a wafer-level light emitting diode structure as claimed in claim 4, wherein two of the predetermined cutting ranges are respectively located on opposite sides of the first electrode.

8. The method for fabricating the wafer-level light emitting diode structure as claimed in claim 1, wherein the first electrode is within or out of each predetermined cutting range.

9. A method for fabricating a wafer-level light emitting diode structure, comprising:
  providing a growth substrate, wherein a first semiconductor layer, a light emitting layer, and a second semiconductor layer are sequentially disposed on the substrate;
  subjecting the first semiconductor layer, the light emitting layer, and the second semiconductor layer with a patterning process to form a plurality of first portions and a plurality of second portions, wherein each of the plurality of second portions has a stacked structure and each of the plurality of first portions has an extended portion of the first semiconductor layer, wherein the plurality of first portions overlap with predetermined cutting ranges;
  forming an first electrode on the extended portion of the first semiconductor layer in each of the plurality of first portions;
  forming a second electrode on the stacked structure in each of the plurality of second portions;
  measuring photoelectric properties of the wafer-level light emitting diode structure via the first electrode and the second electrode; and
  cutting the growth substrate along the predetermined cutting ranges, thus removing each first electrode and obtaining a plurality of light emitting diode chips.

10. The method for fabricating the wafer-level light emitting diode structure as claimed in claim 9, wherein the photoelectric properties comprise a current-voltage characteristic, driving voltage, or spectrum characteristic.

11. A method for fabricating a wafer-level light emitting diode structure, comprising:
  providing a growth substrate, wherein a first semiconductor layer, a light emitting layer, and a second semiconductor layer are sequentially disposed on the substrate;
  subjecting the first semiconductor layer, the light emitting layer, and the second semiconductor layer with a patterning process to form a plurality of first depressed portions and a plurality of second depressed portions, wherein each of the plurality of second depressed portions has a stacked structure and each of the plurality of first depressed portions has an extended portion of the first semiconductor layer, wherein the plurality of first depressed portions overlap with predetermined cutting ranges;
  forming an first electrode on the extended portion of the first semiconductor layer in each of the plurality of first depressed portions;
  forming a second electrode on the stacked structure in each of the plurality of second depressed portions;
  measuring photoelectric properties of the wafer-level light emitting diode structure via the first electrode and the second electrode; and
  cutting the growth substrate along the predetermined cutting ranges, thus removing each first electrode and obtaining a plurality of light emitting diode chips.

* * * * *